(12) United States Patent
Ikiri

(10) Patent No.: US 12,660,220 B2
(45) Date of Patent: Jun. 16, 2026

(54) SEMICONDUCTOR DEVICE

(71) Applicant: RENESAS ELECTRONICS CORPORATION, Tokyo (JP)

(72) Inventor: Yuki Ikiri, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 378 days.

(21) Appl. No.: 18/347,141

(22) Filed: Jul. 5, 2023

(65) Prior Publication Data

US 2024/0097014 A1     Mar. 21, 2024

(30) Foreign Application Priority Data

Sep. 21, 2022     (JP) ................................. 2022-150042

(51) Int. Cl.
H10D 12/00       (2025.01)
H10D 8/00        (2025.01)

(52) U.S. Cl.
CPC ............. H10D 12/481 (2025.01); H10D 8/00 (2025.01)

(58) Field of Classification Search
CPC ............................... H10D 12/481; H10D 8/00
USPC ........................................................ 257/140
See application file for complete search history.

(56) References Cited

U.S. PATENT DOCUMENTS 6,687,140 B2     2/2004  Kitamura
7,847,345 B2     12/2010 Takahashi

| | | | |
|---|---|---|---|
| 11,424,126 B2 | 8/2022 | Kamimura et al. | |
| 2013/0087829 A1* | 4/2013 | Tanabe ................. | H10D 84/617 |
| | | | 257/140 |
| 2018/0151711 A1* | 5/2018 | Yamada .............. | H10D 62/106 |
| 2018/0308839 A1* | 10/2018 | Takahashi .............. | H10D 8/422 |
| 2021/0043758 A1* | 2/2021 | Yokoyama .............. | H10D 8/00 |
| 2021/0398811 A1* | 12/2021 | Kamimura ............. | H10D 8/422 |

FOREIGN PATENT DOCUMENTS

| | | |
|---|---|---|
| JP | 2003-240810 A | 8/2003 |
| JP | 2008-053648 A | 3/2008 |
| JP | 2022-000882 A | 1/2022 |

OTHER PUBLICATIONS

Office Action dated Sep. 16, 2025, issued in corresponding JP Application No. 2022-150042, 14 pages.

* cited by examiner

*Primary Examiner* — Igwe U Anya
(74) *Attorney, Agent, or Firm* — Rimon P.C.

(57)          ABSTRACT

According to one embodiment, a semiconductor device includes a semiconductor substrate, wherein, when viewed from a front surface side, the semiconductor substrate includes: an IGBT region including a plurality of IGBTs; a diode region disposed to surround the IGBT region; a diode region including a plurality of diodes; and a peripheral region disposed to surround the diode region, wherein the IGBT includes: a drift layer; a barrier layer; a channel layer; an emitter layer; a pair of trench electrodes 60; a trench insulating film; a field stop layer; and a collector layer, and a diode includes a drift layer; a semiconductor layer; a channel layer; a pair of trench electrodes; a trench insulating film; a field stop layer; and a cathode layer.

11 Claims, 23 Drawing Sheets

SEMICONDUCTOR DEVICE

CROSS-REFERENCE TO RELATED APPLICATIONS

The disclosure of Japanese Patent Application No. 2022-150042 filed on Sep. 21, 2022 including the specification, drawings and abstract is incorporated herein by reference in its entirety.

BACKGROUND

The present disclosure relates to a semiconductor device. There is disclosed a technique listed below.
[Patent Document 1] Japanese Patent No. 6969662

Patent Document 1 describes a reverse conducting-insulated gate bipolar transistor (RC-IGBT) having IGBT regions and diode regions in one semiconductor substrate. The RC-IGBT in which the IGBTs and the diodes are integrated into one chip can perform reduction (chip shrink) for a guard ring area. Moreover, in the RC-IGBT, heat is dissipated from the diode regions at the time when the IGBT operates, and heat is dissipated from the IGBT regions at the time when the diode operates. Accordingly, the RC-IGBT can reduce chip thermal resistance. Hence, in comparison with a current IGBT, the RC-IGBT can be miniaturized, and in addition, can reduce thermal effects. A future demand for the RC-IGBT is expected to be increased.

SUMMARY

In general, in the RC-IGBT, the IGBT regions and the diode regions are subjected to in-plane arrangement with each other. The IGBTs emit, from an emitter side, carriers (holes) accumulated at a turning-off time. However, the IGBTs do not have, in peripheral regions thereof, contacts connected to emitter electrodes thereof. Therefore, the carriers which have had nowhere to go are concentrated on active ends of the IGBT regions. Then, in some cases, by the carriers concentrated on the active ends, the RC-IGBT may be broken due to heat generation and the like.

Other objects and novel features will be apparent from the description in the specification and the accompanying drawings.

According to one embodiment, a semiconductor device includes: a semiconductor substrate having a first main surface and a second main surface opposite to the first main surface, wherein, when viewed from the first main surface side, the semiconductor substrate includes: an IGBT region including a plurality of IGBTs formed on the semiconductor substrate; a diode region disposed to surround the IGBT region, and including a plurality of diodes formed on the semiconductor substrate; and a peripheral region disposed to surround the diode region, wherein the IGBT includes: a first conductive type drift layer; a first conductive type barrier layer provided more on the first main surface side than the drift layer; a second conductive type channel layer provided more on the first main surface side than the barrier layer; a first conductive type emitter layer provided more on the first main surface side than the channel layer; a pair of trench electrodes provided to sandwich the barrier layer, the channel layer and the emitter layer from both sides in one direction in a plane parallel to the first main surface; a trench insulating film provided between the trench electrodes and the drift layer, the barrier layer, the channel layer and the emitter layer; a first conductive type field stop layer provided more on the second main surface side than the drift layer; and a second conductive type collector layer provided more on the second main surface side than the field stop layer, and wherein the diode includes: the first conductive type drift layer; a first conductive type semiconductor layer provided more on the first main surface side than the drift layer; the second conductive type channel layer provided more on the first main surface side than the semiconductor layer; the pair or trench electrodes provided to sandwich the semiconductor layer and the channel layer from both sides in the one direction; the trench insulating film provided between the trench electrodes and the drift layer, the semiconductor layer and channel layer; the first conductive type field stop layer provided more on the second main surface side than the drift layer; and a first conductive type cathode layer provided more on the second main surface side than the field stop layer.

According to one embodiment, a semiconductor device includes: a semiconductor substrate having a first main surface and a second main surface opposite to the first main surface, wherein, when viewed from the first main surface side, the semiconductor substrate includes: an IGBT region including a plurality of IGBTs formed on the semiconductor substrate; a diode region including a plurality of diodes formed on the semiconductor substrate; and a peripheral region disposed to surround the IGBT region and the diode region, wherein the IGBT includes: a first conductive type drift layer; a first conductive type barrier layer provided more on the first main surface side than the drift layer; a second conductive type channel layer provided more on the first main surface side than the barrier layer; a first conductive type emitter layer provided more on the first main surface side than the channel layer; a pair of trench electrodes provided to sandwich the barrier layer, the channel layer and the emitter layer from both sides in one direction in a plane parallel to the first main surface; a trench insulating film provided between the trench electrodes and the drift layer, the barrier layer, the channel layer and the emitter layer; a first conductive type field stop layer provided more on the second main surface side than the drift layer; and a second conductive type collector layer provided more on the second main surface side than the field stop layer, and wherein the diode includes: the drift layer; a first conductive type semiconductor layer provided more on the first main surface side than the drift layer; the second conductive type channel layer provided more on the first main surface side than the semiconductor layer; the pair or trench electrodes provided to sandwich the semiconductor layer and the channel layer from both sides in the one direction; the trench insulating film provided between the trench electrodes and the drift layer, the semiconductor layer and channel layer; the first conductive type field stop layer provided more on the second main surface side than the drift layer; and a first conductive type cathode r layer provided more on the second main surface side than the field stop layer, and wherein a semiconductor substrate of the peripheral region includes: the drift layer; a second conductive type floating layer provided more on the first main surface side than the drift layer; the first conductive type field stop layer provided more on the second main surface side than the drift layer; and the first conductive type cathode layer provided more on the second main surface side than the field stop layer.

According to the embodiment, the semiconductor device capable of suppressing the breakdown thereof can be provided.

BRIEF DESCRIPTION OF THE DRAWINGS

FIG. 8 is a cross-sectional view illustrating an IGBT in the semiconductor device according to the first embodiment, showing a cross section along a line VIII-VIII of FIG. 7.

DETAILED DESCRIPTION

Figure 1:
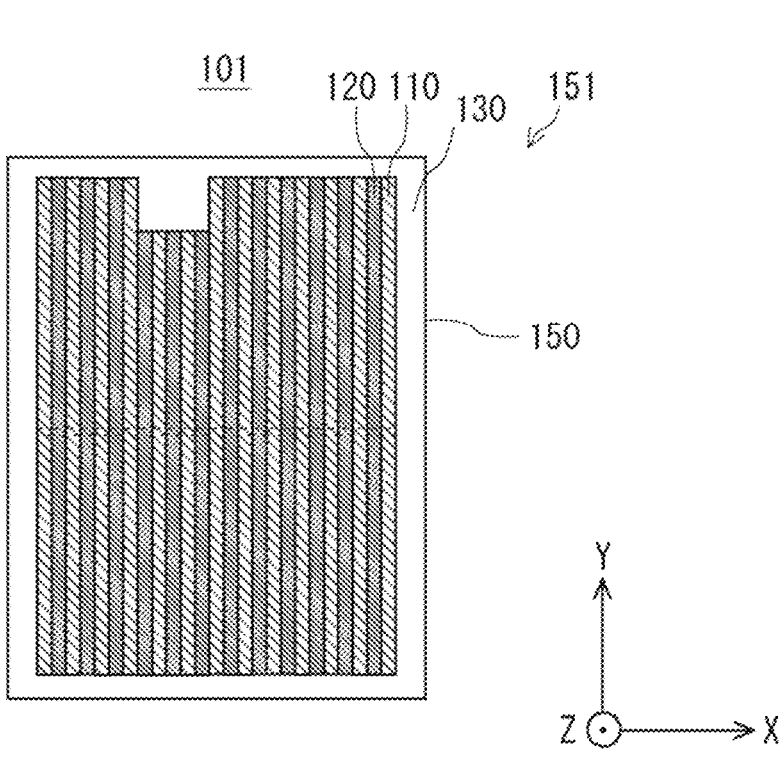
FIG. 1 is a plan view illustrating a front surface of a semiconductor device according to a comparative example.

For clarifying the explanation, the following description and the drawings are omitted and simplified as appropriate. Moreover, when hatching and the like rather cause the drawings to be complicated or cause cross sections thereof to be clearly distinguished from voids, the hatching and the like may sometimes be omitted even on the cross sections and the like. Note that the same reference numerals are assigned to the same elements throughout the drawings and duplicated explanations are omitted as required. Moreover, the reference numerals are appropriately omitted so that the drawings do not become complicated.

First, a description will be given of a semiconductor device according to a comparative example and problems discovered found therein by the inventor. Thereafter, a description will be given of semiconductor devices according to embodiments. Note that the semiconductor device according to the comparative example and the problems thereof are also included in the scope of the technical idea of the embodiments.

Comparative Example

Figure 2:
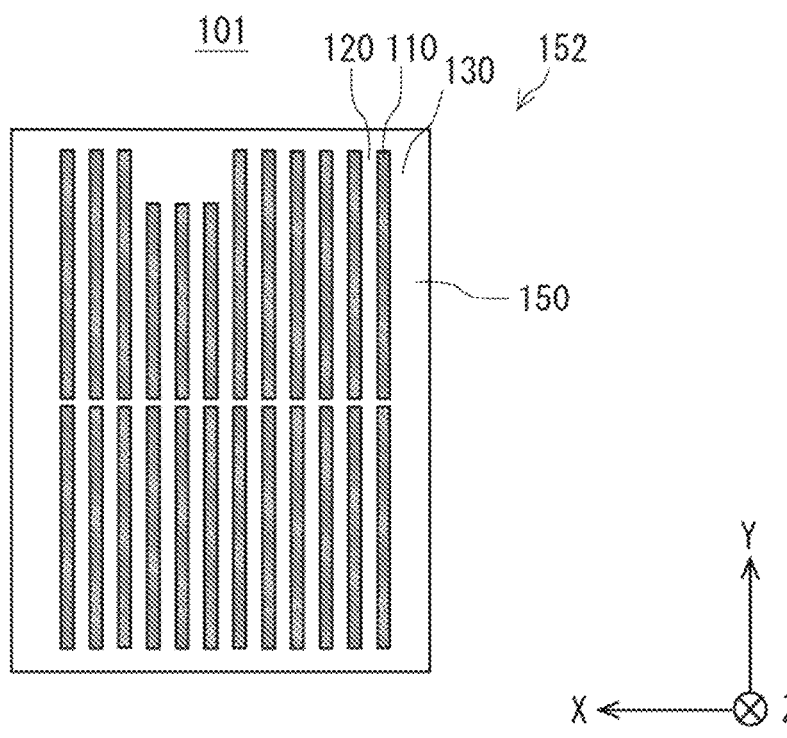
FIG. 2 is a plan view illustrating a back surface of the semiconductor device according to the comparative example.

FIG. 1 is a plan view illustrating a front surface of the semiconductor device according to the comparative example. FIG. 2 is a plan view illustrating a back surface of the semiconductor device according to the comparative example. As shown in FIGS. 1 and 2, in the semiconductor device 101 of the comparative example, when viewed from a front surface 151 side of a semiconductor substrate 150, IGBT regions 110 and diode regions 120 are arranged alternately with each other in one direction. When a direction perpendicular to the front surface of the semiconductor substrate 150 is defined as a Z-axis direction, the IGBT regions 110 and the diode regions 120 extend in a Y-axis direction and are arranged alternately with each other in an X-axis direction. A periphery of the front surface 151 and back surface 152 of the semiconductor substrate 150 is called a peripheral region 130 (also called a termination region). In the semiconductor device 101, for example, emitter electrodes are connected to the front surface 151 side, and collector electrodes are connected to the back surface 152 side.

IGBTs in the IGBT region 110 emit, from an emitter electrode side, carriers (for example, holes) accumulated at a turning-off time. However, in the peripheral region 130, contacts connected to the emitter electrodes are not formed. Therefore, the carriers which have had nowhere to go will be concentrated on ends of active regions such as the IGBT regions 110. Hence, the semiconductor device 101 may sometimes cause a heat breakdown due to this concentration of the carriers. As described above, the semiconductor device 101 of the comparative example has a problem of the heat breakdown due to such a carrier concentration.

Figure 3:
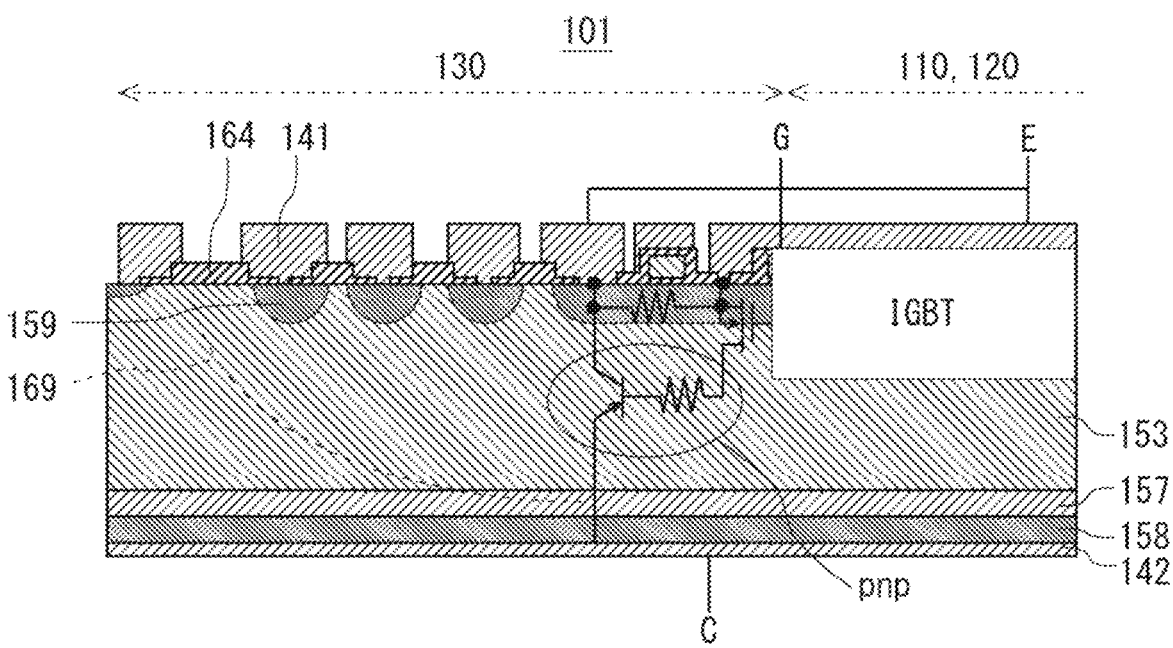
FIG. 3 is a cross-sectional view illustrating a peripheral region of the semiconductor device according to the comparative example.

Moreover, the semiconductor device 101 of the comparative example has a problem of a leak current. FIG. 3 is a cross-sectional view illustrating the peripheral region 130 of the semiconductor device 101 according to the comparative example. As shown in FIG. 3, in the peripheral region 130 in which a depletion layer 169 spreads, the semiconductor device 101 includes an N− type drift layer 153, a P type semiconductor layer 159, an insulating film 164, an emitter electrode 141, an N+ type field stop layer 157, a P+ type collector layer 158, and a collector electrode 142.

As described above, in the semiconductor device 101 of the comparative example, the P+ type collector layer 158 is formed on the back surface 152 of the peripheral region 130. Hence, in the semiconductor device 101 of the comparative example, a parasitic pnp bipolar composed of the P+ type collector layer 158, the N+ type field stop layer 157 and the P type semiconductor layer 159 is formed. Thus, undesirably, a leak current flows to the semiconductor device 101 via the parasitic pnp bipolar. The leak current induces the heat breakdown of the semiconductor device 101, and causes a loss of an application.

For example, in some cases, the semiconductor device has a gate pad on one end on one direction side on the front surface 151 of the semiconductor substrate 150. At the turning-off time of the IGBTs, a gate delay due to a gate wiring resistance occurs in a region distant from the gate pad. Thus, a current concentration occurs in the semiconductor device.

An area of the RC-IGBT becomes smaller than that of a parallel connection of the IGBTs and the diodes. However, it is assumed that a size of one chip becomes larger than a single unit of the IGBT. Therefore, it is conceived that a potential difference between the respective emitter pads due to the gate delay is increased. Hence, the current concentration due to the gate delay occurs in the end of the one direction, which is separate from the gate pad.

First Embodiment

Figure 4:
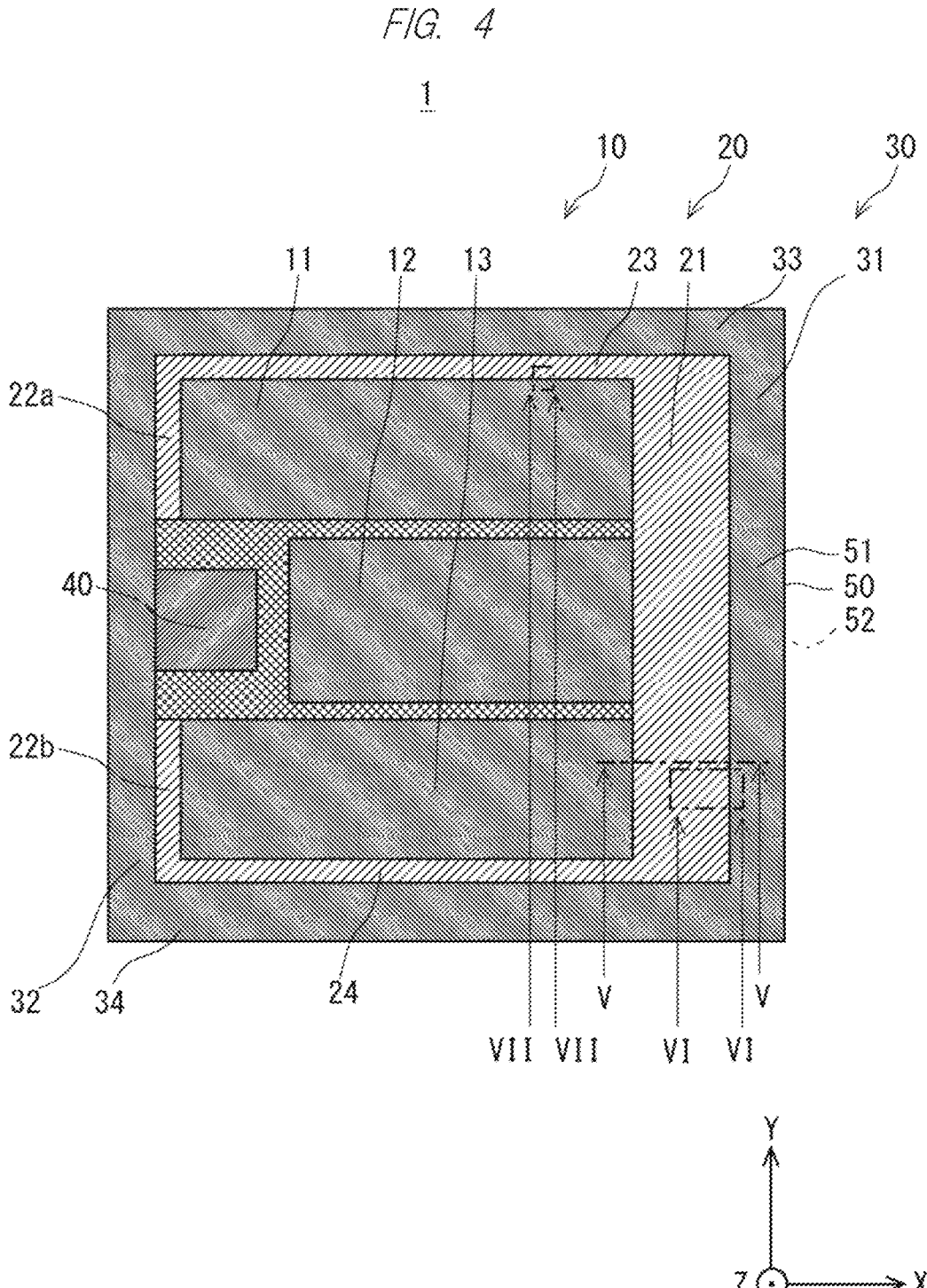
FIG. 4 is a plan view illustrating a semiconductor device according to a first embodiment.
Figure 5:
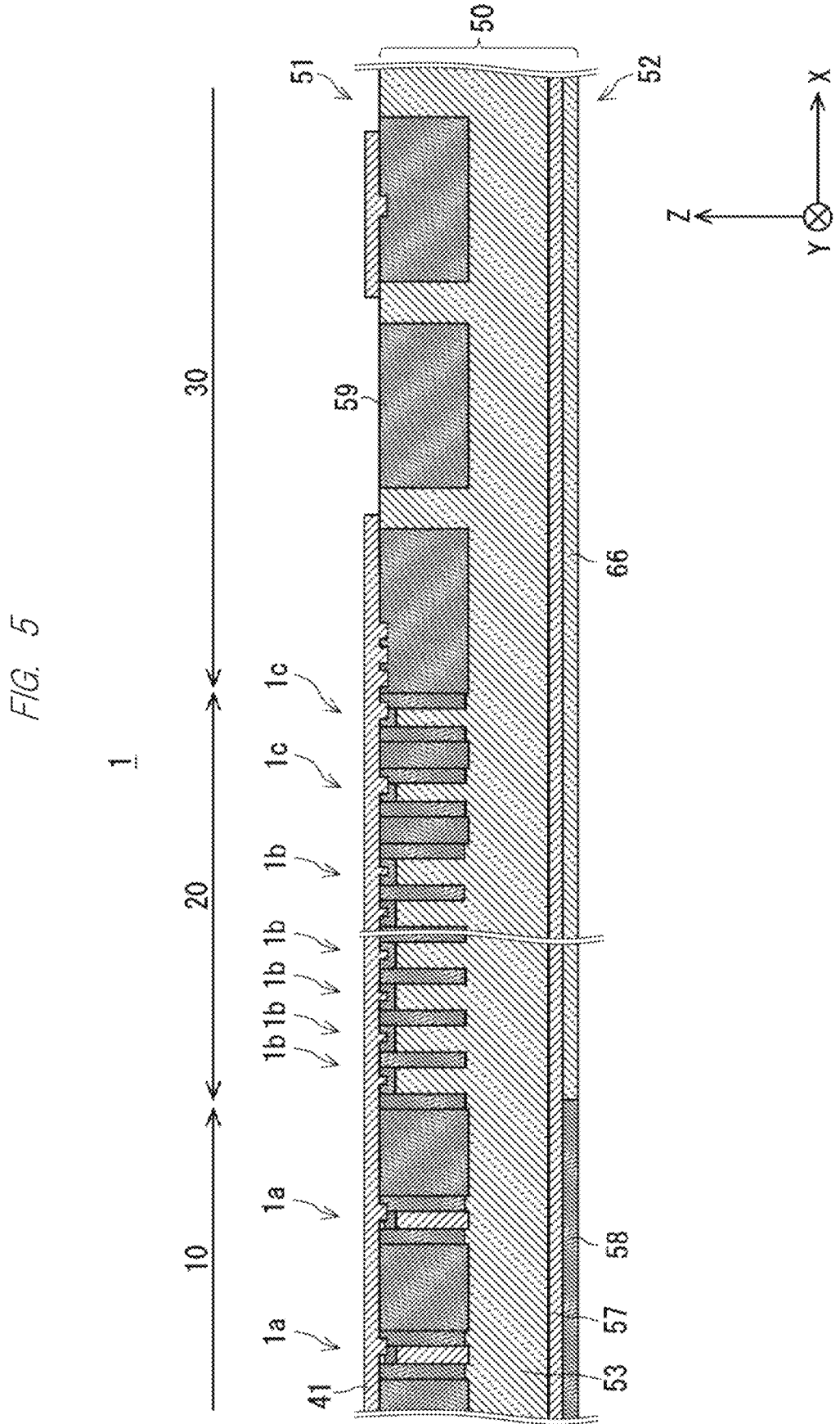
FIG. 5 is a cross-sectional view illustrating the semiconductor device according to the first embodiment, showing a cross section along a line V-V of FIG. 4.
Figure 6:
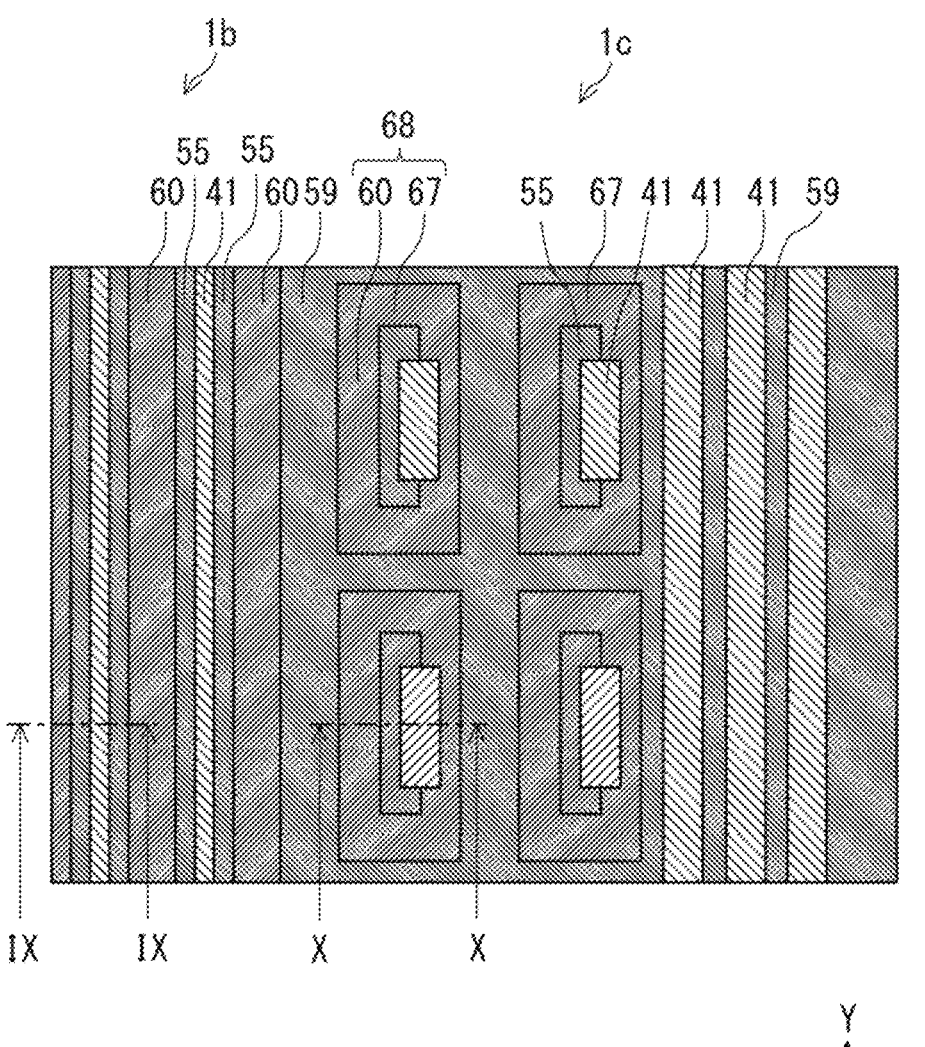
FIG. 6 is an enlarged plan view illustrating a diode region in a semiconductor device according to the first embodiment, showing a plane along a line VI-VI of FIG. 4.
Figure 6:
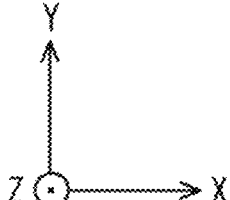
Figure 7:
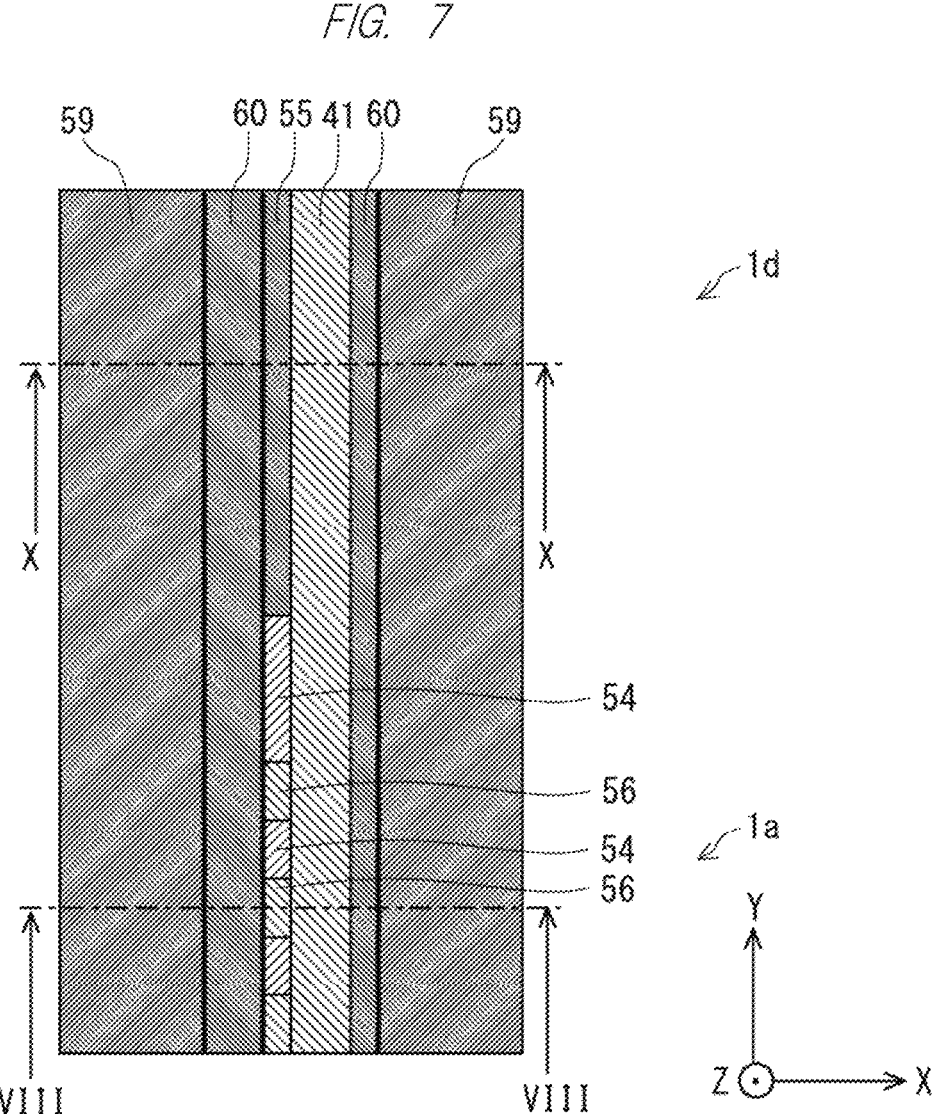
FIG. 7 is a plan view illustrating an IGBT region and a diode region in the semiconductor device according to the first embodiment, showing a plane along a line VII-VII of FIG. 4.
Figure 8:
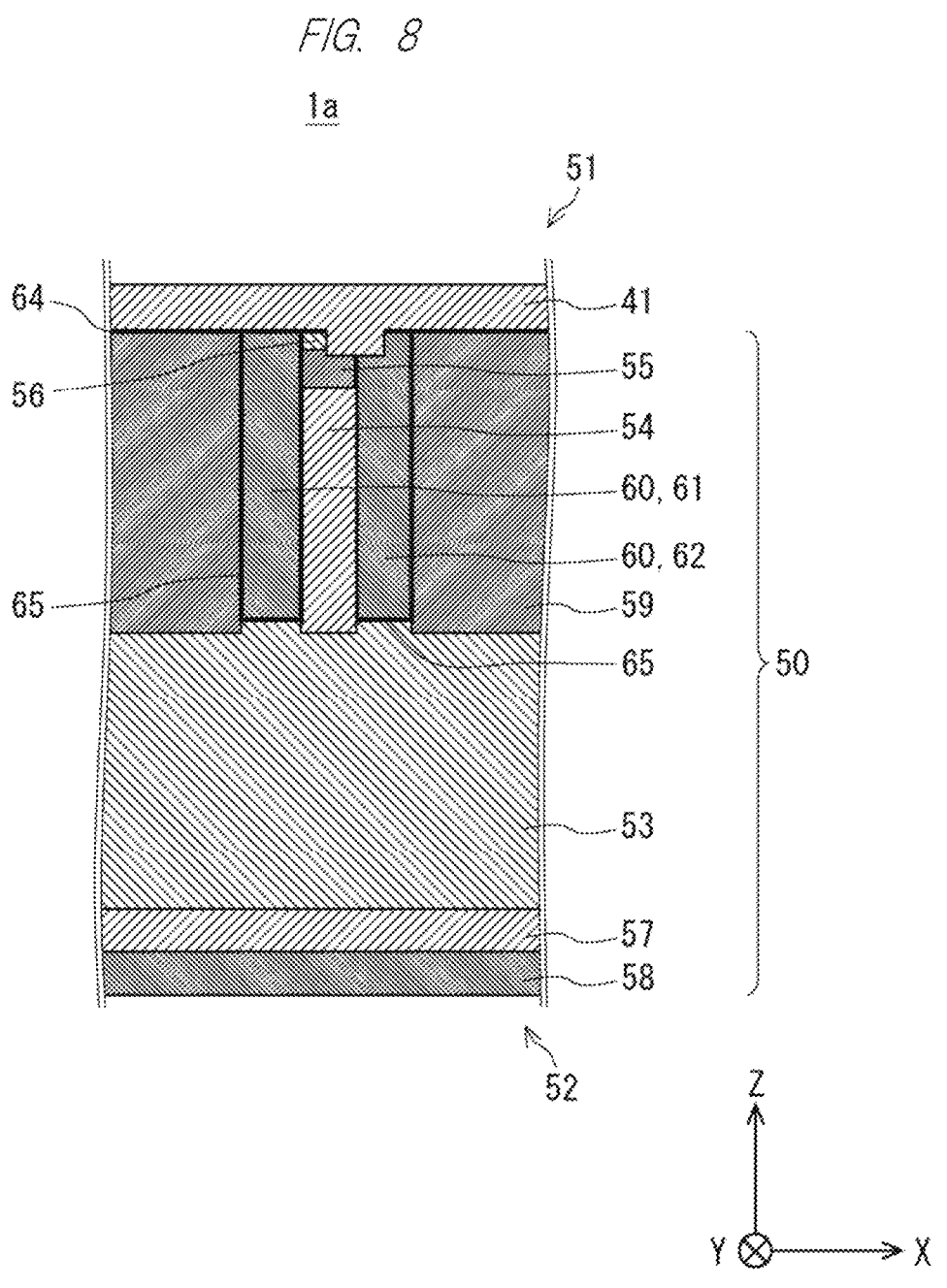
Figure 9:
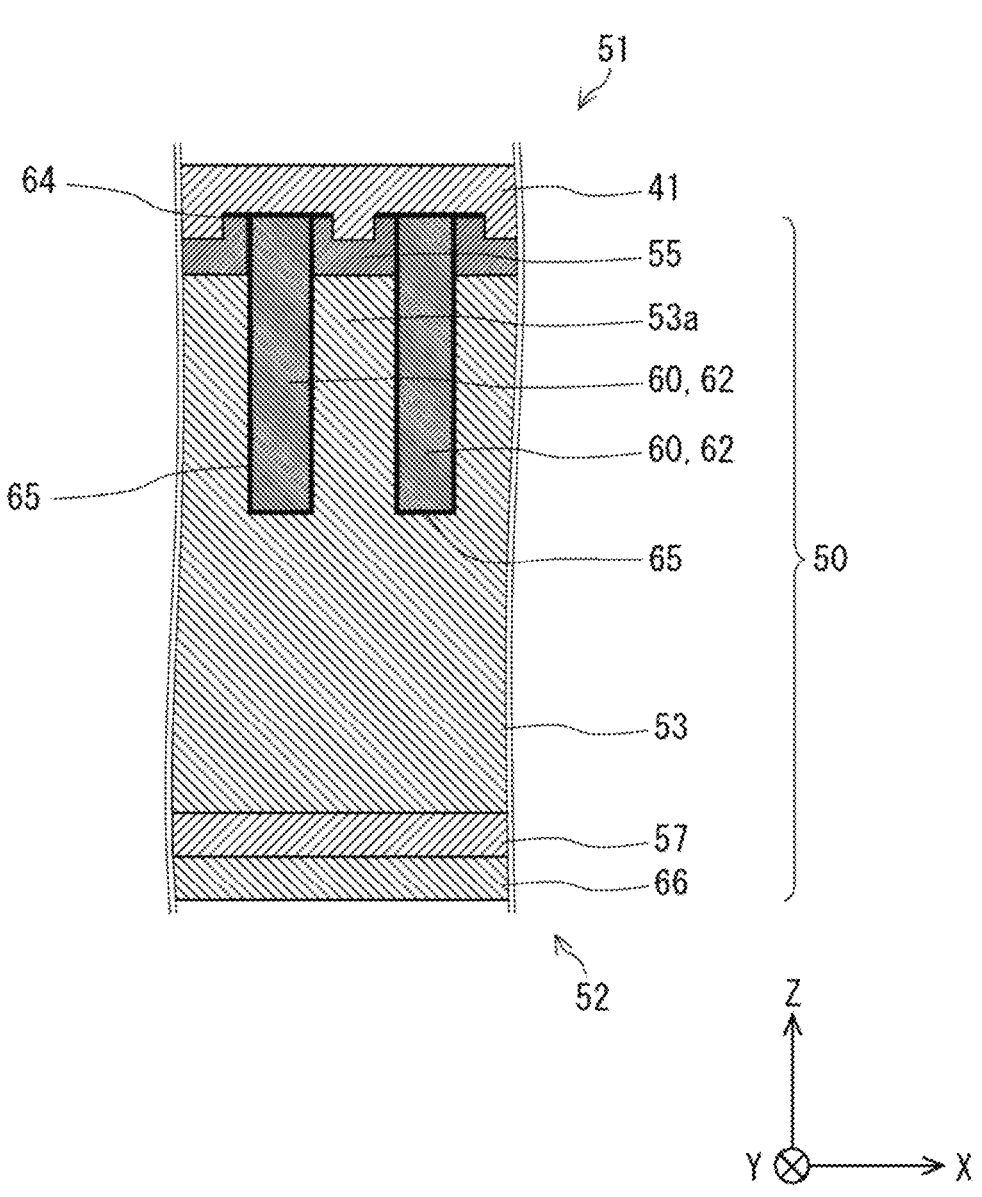
FIG. 9 is a cross-sectional view illustrating a diode in the semiconductor device according to the first embodiment, showing a cross section along a line IX-IX of FIG. 6.
Figure 10:
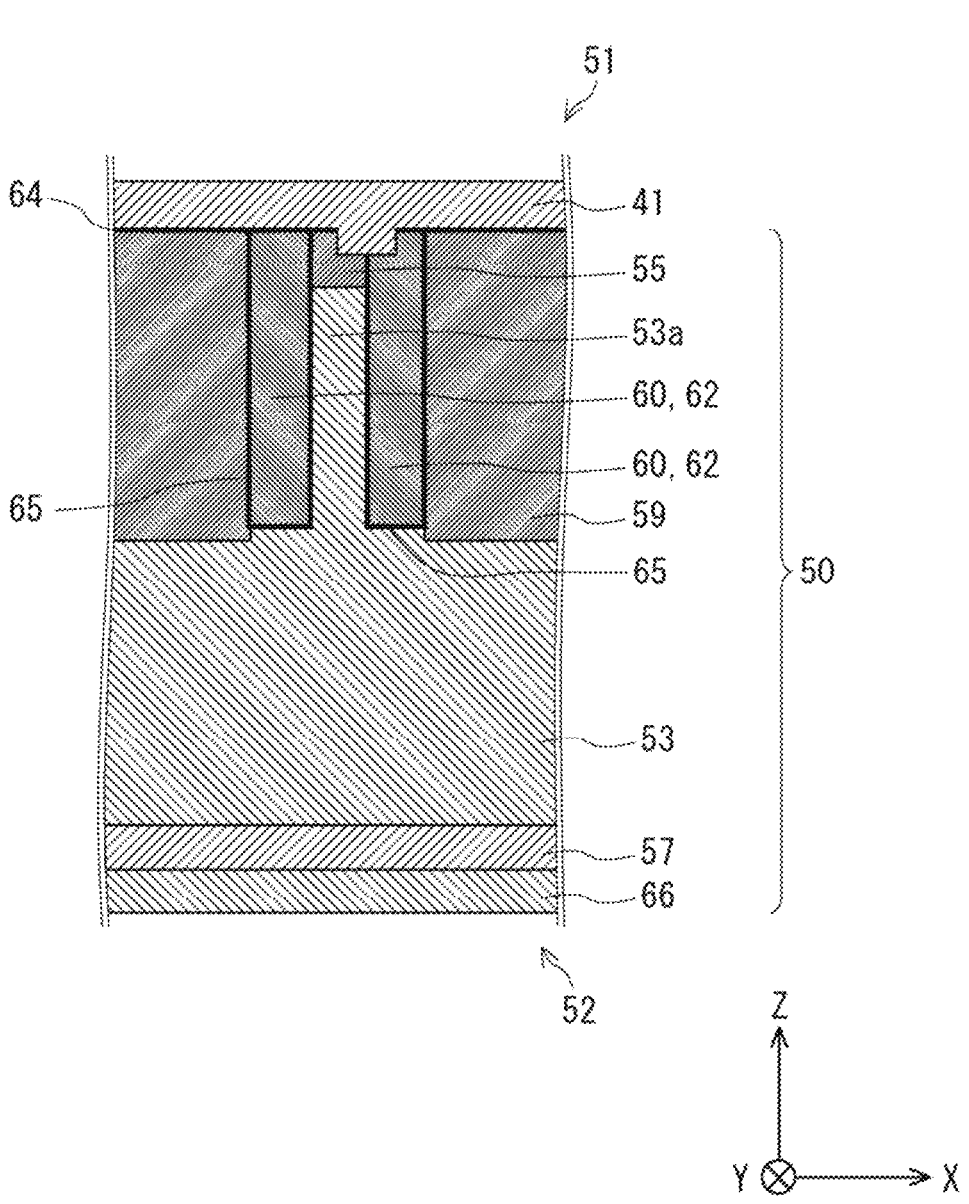
FIG. 10 is a cross-sectional view illustrating a diode in the semiconductor device according to the first embodiment, showing a cross section along a line X-X of FIG. 6 and a line X-X of FIG. 7.

Next, a semiconductor device according to a first embodiment will be described. The semiconductor device of this embodiment solves at least one of the problems in the semiconductor device 101 of the comparative example mentioned above. FIG. 4 is a plan view illustrating the semiconductor device according to the first embodiment. FIG. 5 is a cross-sectional view illustrating the semiconductor device according to the first embodiment, showing a cross section along a line V-V of FIG. 4. FIG. 6 is an enlarged plan view illustrating a diode region in the semiconductor device according to the first embodiment, showing a plane along a line VI-VI of FIG. 4. FIG. 7 is a plan view illustrating an IGBT region and a diode region in the semiconductor device according to the first embodiment, showing a plane along a line VII-VII of FIG. 4. FIG. 8 is a cross-sectional view illustrating an IGBT in the semiconductor device according to the first embodiment, showing a cross section along a line VIII-VIII of FIG. 7. FIG. 9 is a cross-sectional view illustrating a diode in the semiconductor device according to the first embodiment, showing a cross section along a line IX-IX of FIG. 6. FIG. 10 is a cross-sectional view illustrating a diode in the semiconductor device according to the first embodiment, showing a cross section along a line X-X of FIG. 6 and a line X-X of FIG. 7. In FIGS. 6 and 7, a part of an emitter electrode 41 and a part of an insulating film 64 are removed.

As shown in FIGS. 4 to 10, the semiconductor device 1 includes a semiconductor substrate 50 having a front surface 51 (a first main surface) and a back surface 52 (a second main surface). The back surface 52 is a surface opposite to the front surface 51. The semiconductor device 1 may include: the emitter electrode 41 provided on the front surface 51 with the insulating film 64 interposed therebetween; a gate electrode 40 provided on the front surface 51 with the insulating film 64 interposed therebetween; and a collector electrode provided on the back surface 52.

Herein, an XYZ-orthogonal coordinate axis system is introduced for convenience of explaining the semiconductor device 1. A direction perpendicular to the front surface 51 is defined as a Z-axis direction, and two directions perpendicular to the Z are defined as an X-axis direction and a Y-axis direction. A direction going from the back surface 52 toward the front surface 51 is defined as a +Z-axis direction. For convenience, the +Z-axis direction is defined as "upward", and a −Z-axis direction is defined as "downward". Note that "upward" and "downward" do not indicate directions when the semiconductor device 1 that is actual is used.

When viewed from the front surface 51 side, the semiconductor device 1 has an IGBT region 10, a diode region 20 and a peripheral region 30. The IGBT region includes a plurality of IGBTs 1a formed on the semiconductor substrate 50. The diode region 20 includes a plurality of diodes 1b to 1d formed on the semiconductor substrate 50. The diode region 20 is disposed between the IGBT region 10 and the peripheral region 30. The diode region 20 is disposed so as to surround the IGBT region 10. The peripheral region 30 is disposed so as to surround the IGBT region 10 and the diode region 20.

For example, the IGBT region 10 has a region 11, a region 12 and a region 13, which extend in the X-axis direction. The region 11, the region 12 and the region 13 are arrayed in the Y-axis direction. Specifically, the region 11 is disposed in a +Y-axis direction side of the IGBT region 10, and the region 13 is disposed in a −Y-axis direction side of the IGBT region 10. The region 12 is disposed between the region 11 and the region 13.

Broadly speaking, the diode region 20 has a rectangular frame shape. When viewed from the front surface 51 side, the diode region 20 has a region 21 (a first portion), a region 22a (a second portion), a region 22b (a second portion), a region 23 (a third portion), and a region 24 (a fourth portion).

The region 21 is a portion more on the +X-axis direction side than the IGBT region 10. Specifically, the region 21 is a portion more on the +X-axis direction side than the region 11, the region 12 and the region 13. The region 21 extends in the Y-axis direction. The region 21 is disposed between one end on the +X-axis direction side in the X-axis direction of the IGBT region 10 and the peripheral region 30. The region 21 separates the IGBT region 10 and the peripheral region from each other in the X-axis direction.

The region 22a is a portion more on the −X-axis direction side than the region 11 in the IGBT region 10. The region 22a extends in the Y-axis direction. The region 22b is a portion more on the −X-axis direction side than the region 13 in the IGBT region 10. The region 22b extends in the Y-axis direction. The region 22a and the region 22b are disposed between the other end on the −X-axis direction side in the X-axis direction of the IGBT region 10 and the peripheral region 30. The region 22a and the region 22b separate the IGBT region 10 and the peripheral region 30 from each other in the X-axis direction.

The region 23 is a portion more on the +Y-axis direction side than the IGBT region 10. Specifically, the region 23 is a portion more on the +Y-axis direction side than the region 11. The region 23 extends in the X-axis direction. The region 23 is disposed between one end on the +Y-axis direction side in the Y-axis direction of the IGBT region 10 and the peripheral region 30. The region 23 separates the IGBT region 10 and the peripheral region 30 from each other in the Y-axis direction.

The region 24 is a portion more on the −Y-axis direction side than the IGBT region 10. Specifically, the region 24 is a portion more on the −Y-axis direction side than the region 13. The region 24 extends in the X-axis direction. The region 24 is disposed between the other end on the −Y-axis direction side in the Y-axis direction of the IGBT region 10 and the peripheral region 30. The region 24 separates the IGBT region 10 and the peripheral region 30 from each other in the Y-axis direction.

A width of the region 21 that separates the IGBT region 10 and the peripheral region 30 from each other in the X-axis direction is larger than a width of each of the region 22a and the region 22b which separate the IGBT region 10 and the peripheral region 30 from each other in the X-axis direction. Moreover, a width of the region 21 that separates the IGBT region 10 and the peripheral region 30 from each other in the X-axis direction is larger than a width of each of the region 23 and the region 24 which separate the IGBT region 10 and the peripheral region 30 from each other in the Y-axis direction.

The peripheral region 30 has a rectangular frame shape. The peripheral region 30 has a region 31, a region 32, a region 33 and a region 34. The region 31 is a portion more on the +X-axis direction side than the region 21. The region 31 extends in the Y-axis direction. The region 32 is a portion more on the −X-axis direction side than the region 22a and the region 22b. The region 32 extends in the Y-axis direction. The region 33 is a portion more on the +Y-axis direction side than the region 23. The region 33 extends in the X-axis direction. The region 34 is a portion more on the +Y-axis direction side than the region 24. The region 34 extends in the X-axis direction.

The gate electrode 40 is disposed on the other side in the X-axis direction of the IGBT region 10. For example, the gate electrode 40 is disposed on the −X-axis direction side of the IGBT region 10. Specifically, the gate electrode 40 is disposed more on the −X-axis direction side than the region 12. The gate electrode 40 is surrounded by the region 11 disposed more on the +Y-axis direction side than the gate electrode 40, the region 12 disposed on the +X-axis direction side than the gate electrode 40, and the region 13 disposed more on the −Y-axis direction side than the gate electrode 40. The gate electrode 40 may be disposed on the front surface 51 with insulating film 64 interposed therebetween.

The semiconductor device 1 of this embodiment has the diode region 20 disposed in the form of being coupled to the peripheral region 30 in the region surrounding the IGBT region 10. Moreover, the semiconductor device 1 broadens the width of the diode region 20 at the position distant from the gate electrode 40.

IGBT Region

On the semiconductor substrate 50 of the IGBT region 10, the plurality of IGBTs 1a are formed. Each of the IGBTs 1a has an N− type drift layer 53, an N+ type barrier layer 54, a P type channel layer 55, an N+ type emitter layer 56, a pair of trench electrodes 60, a trench insulating film 65, an N+ type field stop layer 57, a P++ type collector layer 58, and a P type floating layer 59. In order that the drawing is prevented from becoming complicated, the trench insulating film 65 and the insulating film 64 on the semiconductor substrate 50 are indicated by thick lines.

Note that the N++ type and the P++ type represent an N conductive type and a P conductive type, each of which has a low resistance, respectively. The N+ type and the P+ type represent an N conductive type and a P conductive type, each of which has a resistance higher than each of the N++ type and the P++ type but lower than each of the N type and the P type, respectively. A P− type and an N− type represent to be an N conductive type and a P conductive type, each of which has a resistance higher than each of the N type and the P type, respectively. Hence, the N type and the P type represent to be an N conductive type and a P conductive type, each of which has a resistance between each of the N+ type and the P+ type and each of the P− type and the N− type, respectively. The N+ type and the P+ type represent to be an N conductive type and a P conductive type, each of which has a resistance between each of the N++ type and the P++ type and each of the P type and the N type, respectively. Hereinafter, the above applies to similar cases unless specifically mentioned. The N conductive type is sometimes called a first conductive type, and the P conductive type is sometimes called a second conductive type.

Note that the N conductive type may be defined as the second conductive type, and the P conductive type may be defined as the first conductive type. Moreover, a semiconductor device in which the conductive types of the respective configurations of the present disclosure are reversed is also included in the scope of the technical idea of the present disclosure. Further, the resistances of the respective N++ type, N+ type, N-type and N-type semiconductor layers are examples. Such a case where the resistances are larger than those shown in the present disclosure may be allowed to be present, and such a case where the resistances are smaller than those shown in the present disclosure may be allowed to be present. Likewise, the resistances of the respective P++ type, P+ type, P-type and P-type semiconductor layers are examples. Magnitude relationships of the resistances of the respective semiconductor layers may be reversed in some cases.

The N− type drift layer 53 is provided more on the front surface 51 side than the N+ type field stop layer 57. As described later, the N− type drift layer 53 is provided over the IGBT region 10, the diode region 20 and the peripheral region 30.

The N+ type barrier layer 54 is provided more on the front surface 51 side than the N− type drift layer 53. When viewed from the front surface 51 side, the N+ type barrier layer 54 extends in the Y-axis direction for example. The N+ type barrier layer 54 is sandwiched from both sides thereof in the X-axis direction by the pair of trench electrodes 60. That is, the N+ type barrier layer 54 is disposed between the pair of trench electrodes 60.

The P type channel layer 55 is provided more on the front surface 51 side than the N+ type barrier layer 54. The P type channel layer 55 is disposed between the pair of trench electrodes 60. The P type channel layer 55 connects to the emitter electrode 41 loaded into a through hole that penetrates the insulating film 64 and the N+ type emitter layer 56.

The N+ type emitter layer 56 is provided more on the front surface 51 side than the P type channel layer 55. The N+ type emitter layer 56 is disposed between the pair of trench electrodes 60. The N+ type emitter layer 56 connects to the emitter electrode 41 loaded into the through hole that penetrates the insulating film 64.

The pair of trench electrodes 60 are provided so as to sandwich the N+ type barrier layer 54, the P type channel layer 55 and the N+ type emitter layer 56 from both sides in the X-axis direction. When viewed from the front surface 51 side, each of the trench electrodes 60 extends in the Y-axis direction for example. For example, in the pair of trench electrodes 60, the trench electrode 60 on the −X-axis direction side is called a trench electrode 61, and the trench electrode 60 on the +X-axis direction side is called a trench electrode 62. Hence, the pair of trench electrodes 60 of the IGBT 1a includes the trench electrode 61 (a first trench electrode) and the trench electrode 62 (a second trench electrode). The trench electrode 61 connects to the gate electrode 40, for example, with a gate wiring (not shown) interposed therebetween. The trench electrode 62 connects to the emitter electrode 41 loaded into the through hole that penetrates the insulating film 64. Hence, the N+ type emitter layer 56, the P type channel layer 55 and the trench electrode 62 connect to the emitter electrode 41. A structure between the pair of trench electrodes 60 is called an inter-trench structure. For example, the inter-trench structure of the IGBT 1a includes the N+ type barrier layer 54, the P type channel layer 55, and, the N+ type emitter layer 56. The inter-trench structure of the IGBT 1a may include other members such as a contact layer.

The P type floating layer 59 is provided between the IGBTs 1a adjacent to each other in the plurality of IGBTs 1a. For example, the P type floating layer 59 is provided between the trench electrode 62 of the IGBT 1a on the −X-axis direction side and the trench electrode 61 of the IGBT 1a on the +X-axis direction side in the IGBTs 1a adjacent to each other. The P type floating layer 59 is provided on an opposite side to the N+ type barrier layer 54, the P type channel layer 55 and the N+ type emitter layer 56 while sandwiching the trench electrode 60 therewith.

The P type floating layer 59 is provided more on the front surface 51 side than the N− type drift layer 53. Hence, on the N− type drift layer 53, along the X-axis direction from the −X-axis direction side, there are arranged the P type floating layer 59, the trench electrode 61 (covered with the trench insulating film 65), the inter-trench structure, the trench electrode 62 (covered with the trench insulating film 65), and the P type floating layer 59. In the IGBT region 10, such a configuration is arranged so as to be repeated in the X-axis direction.

The P type floating layer 59 between the P type floating layer 59 on one end on the +X-axis direction side in the X-axis direction of the IGBT region 10 and the P type floating layer 59 on the other end on the −X-axis direction side in the X-axis direction of the IGBT region 10 is in contact with the trench electrode 61 and the trench electrode 62. In other words, in a region of the IGBT region 10, which is other than the ends in the X-axis direction, the P type floating layers 59 are formed between the IGBTs 1a adjacent to one another.

The trench insulating film 65 is provided between the trench electrodes 60 and the N− type drift layer 53, the N+ type barrier layer 54, the P type channel layer 55, the N+ type emitter layer 56 and the P type floating layer 59.

The N+ type field stop layer 57 is provided more on the back surface 52 side than the N− type drift layer 53. The P++ type collector layer 58 is provided more on the back surface 52 side than the N+ type field stop layer 57. The P++ type collector layer 190 is connected to a collector electrode. Note that the collector electrode is omitted so that the drawings do not become complicated.

Diode Region

In the semiconductor substrate 50 of the diode region 20, a plurality of diodes are formed. The plurality of diodes include a plurality of diodes 1b, a plurality of diodes 1c and a plurality of diodes 1d. In some cases, the diodes 1b, the diodes 1c and the diodes 1d are collectively called diodes 1bcd. The diodes 1b, the diodes 1c and the diodes 1d have mutually different shapes of the semiconductor layers and the like.

Each of the diodes 1b has the N− type drift layer 53, an N− type semiconductor layer 53a, the P type channel layer 55, the pair of trench electrodes 60, the trench insulating film 65, the N+ type field stop layer 57 and an N++ type cathode layer 66.

The N− type drift layer 53 is provided more on the front surface 51 side than the N+ type field stop layer 57. The N− type drift layer 53 is provided over the IGBT region 10, the diode region 20 and the peripheral region 30.

The N− type semiconductor layer 53a is provided more on the front surface 51 side than the N− type drift layer 53. When viewed from the front surface 51 side, the N− type semiconductor layer 53a extends in the Y-axis direction for example. The N− type semiconductor layer 53a may be one in which a part of the N− type drift layer 53 extends between the pair of trench electrodes 60. Hence, the N− type semiconductor layer 53a may have the same resistance value as that of the N− type drift layer 53. The N− type semiconductor layer 53a is sandwiched from both sides thereof in the X-axis direction by the pair of trench electrodes 60. That is, the N− type semiconductor layer 53a is disposed between the pair of trench electrodes 60.

The P type channel layer 55 is provided more on the front surface 51 side than the N− type semiconductor layer 53a. The P type channel layer 55 is disposed between the pair of trench electrodes 60. The P type channel layer 55 connects to the emitter electrode 41 loaded into the through hole that penetrates the insulating film 64.

The pair of trench electrodes 60 are provided so as to sandwich the N− type semiconductor layer 53a and the P type channel layer 55 from both sides in the X-axis direction. When viewed from the front surface 51 side, each of the trench electrodes 60 extends in the Y-axis direction for example. For example, each of the trench electrodes 60 is connected to the emitter electrode 41 through an emitter wiring (not shown). Hence, similarly to the trench electrodes 62 of the IGBT 1a, the trench electrodes 60 connect to the emitter electrode 41. Accordingly, the pair of trench electrodes 60 of the diode 1b include two trench electrodes 62.

A structure between the pair of trench electrodes 60 is called an inter-trench structure. For example, the inter-trench structure of the diode 1b includes the N− type semiconductor layer 53a and the P type channel layer 55. The inter-trench structure of the diode 1b may include other members such as a contact layer.

On the N− type drift layer 53, along the X-axis direction from the −X-axis direction side, there are arranged the trench electrode 62 (covered with the trench insulating film 65), the inter-trench structure, and the trench electrode 62 (covered with the trench electrode 65). In a region in the diode region 20, in which the plurality of diodes 1b are arranged, such a configuration is arranged so as to be repeated in the X-axis direction.

The trench insulating film 65 is provided between the trench electrodes 60 and the N− type drift layer 53, the N− type semiconductor layer 53a and the P type channel layer 55.

The N+ type field stop layer 57 is provided more on the back surface 52 side than the N− type drift layer 53. The N++ type cathode layer 66 is provided more on the back surface 52 side than the N+ type field stop layer 57. The N++ type cathode layer 66 is connected to the collector electrode.

The diode region 20 may include the plurality of diodes 1c formed on the semiconductor substrate 50. Each of the diodes 1c includes a different configuration than that of the diode 1b. Specifically, the diodes 1c includes a coupling trench electrode that couples the trench electrodes 60 adjacent to each other. The trench electrodes 60 and the coupling trench electrode form a square tube trench electrode.

The diode 1c has the N– type drift layer 53, the N– type semiconductor layer 53a, the P type channel layer 55, a square tube trench electrode 68, the trench insulating film 65, the N+ type field stop layer 57, the N++ type cathode layer 66, and the P type floating layer 59. The square tube trench electrode 68 includes the pair of trench electrodes 60 and a pair of coupling trench electrodes 67.

The N– type drift layer 53 is provided more on the front surface 51 side than the N+ type field stop layer 57. The N– type drift layer 53 is provided over the IGBT region 10, the diode region 20 and the peripheral region 30.

The N– type semiconductor layer 53a is provided more on the front surface 51 side than the N– type drift layer 53. The N– type semiconductor layer 53a is disposed in an inside surrounded by the square tube trench electrode 68. That is, in the X-axis direction, the N– type semiconductor layer 53a is sandwiched from both sides thereof by the pair of trench electrodes 60, and in the Y-axis direction, is sandwiched from both sides thereof by the pair of coupling trench electrodes 67. The N– type semiconductor layer 53a may be one in which a part of the N– type drift layer 53 extends to the inside surrounded by the square tube trench electrode 68. Hence, the N– type semiconductor layer 53a may have the same resistance value as that of the N– type drift layer 53.

The P type channel layer 55 is provided more on the front surface 51 side than the N– type semiconductor layer 53a. The P type channel layer 55 is disposed in the inside surrounded by the square tube trench electrode 68. That is, in the X-axis direction, the P type channel layer 55 is sandwiched from both sides thereof by the pair of trench electrodes 60, and in the Y-axis direction, is sandwiched from both sides thereof by the pair of coupling trench electrodes 67. The P type channel layer 55 connects to the emitter electrode 41 loaded into the through hole that penetrates the insulating film 64.

The square tube trench electrode 68 has a square tube shape in which a central axis extends in the Z-axis direction. The square tube trench electrode 68 is provided so as to sandwich the N– type semiconductor layer 53a and the P type channel layer 55 from both sides in the X-axis direction, and to sandwich the same from both sides in the Y-axis direction. When viewed from the front surface 51 side, the pair of coupling trench electrodes 67 in the square tube trench electrode 68 extend in a direction that intersects the direction where the trench electrodes 60 extend. Specifically, the pair of coupling trench electrodes 67 extend in the X-axis direction. The pair of coupling trench electrodes 67 connect to the pair of trench electrodes 60. One of the coupling trench electrodes 67 connects to one end of each of the trench electrodes 60. The other of the coupling trench electrodes 67 connects to the other end of each of the trench electrodes 60.

Specifically, one end on the +X-axis direction side of the coupling trench electrode 67 on the +Y-axis direction side connects to one end on the +Y-axis direction side of the trench electrode 60 on the +X-axis direction side. The other end on the –X-axis direction side of the coupling trench electrode 67 on the +Y-axis direction side connects to one end on the +Y-axis direction side of the trench electrode 60 on the –X-axis direction side. One end on the +X-axis direction side of the coupling trench electrode 67 on the –Y-axis direction side connects to the other end on the –Y-axis direction side of the trench electrode 60 on the +X-axis direction side. The other end on the –X-axis direction side of the coupling trench electrode 67 on the –Y-axis direction side connects to the other end on the –Y-axis direction side of the trench electrode 60 on the –X-axis direction side. Thus, the pair of coupling trench electrodes 67 and the pair of trench electrodes 60 form the square tube trench electrode 68.

The square tube trench electrode 68 connects to the emitter electrode 41 loaded into the through hole that penetrates the insulating film 64. Hence, the N+ type emitter layers 56, the P type channel layer 55, the trench electrode 62 (the IGBT 1a) and the square tube trench electrode 68 connect to the emitter electrode 41. An internal structure surrounded by the square tube trench electrode 68 is called the inter-trench structure. For example, the inter-trench structure of the diode 1c includes the N– type semiconductor layer 53a and the P type channel layer 55. The inter-trench structure of the diode 1c may include other members such as a contact layer.

The P type floating layer 59 is provided between the diodes 1c adjacent to each other in the plurality of diodes 1c. For example, the P type floating layer 59 is provided between the square tube trench electrode 68 of the diode 1c on the –X-axis direction side and the square tube trench electrode 68 of the diode 1c on the +X-axis direction side in the diodes 1c adjacent to each other in the Y-axis direction. Moreover, the P type floating layer 59 is provided between the square tube trench electrode 68 of the diode 1c on the –Y-axis direction side and the square tube trench electrode 68 of the diode 1c on the +Y-axis direction side in the diodes 1c adjacent to each other in the Y-axis direction. The P type floating layer 59 is provided on an opposite side to the N– type semiconductor layer 53a and the P type channel layer 55 while sandwiching the square tube trench electrode 68 therewith.

The P type floating layer 59 is provided more on the front surface 51 side than the N– type drift layer 53. Hence, on the N– type drift layer 53, along the X-axis direction from the –X-axis direction side, there are arranged the P type floating layer 59, the trench electrode 60 (covered with the trench insulating film 65), the inter-trench structure, the trench electrode 60 (covered with the trench insulating film 65), and the P type floating layer 59. In a region in the diode region 20, in which the plurality of diodes 1c are arranged, such a configuration is arranged so as to be repeated in the X-axis direction. Moreover, on the N-type drift layer 53, along the Y-axis direction from the –Y-axis direction side, there are arranged the P type floating layer 59, the coupling trench electrode 67 (covered with the trench insulating film 65), the inter-trench structure, the coupling trench electrode 67 (covered with the trench insulating film 65), and the P type floating layer 59. In a region in the diode region 20, in which the plurality of diodes 1c are arranged, such a configuration is arranged so as to be repeated in the Y-axis direction.

The trench insulating film 65 is provided between the square tube trench electrodes 68 and the N– type drift layer 53, the N– type semiconductor layer 53a, the P type channel layer 55 and the P type floating layer 59.

The N+ type field stop layer 57 is provided more on the back surface 52 side than the N– type drift layer 53. The N++ type cathode layer 66 is provided more on the back surface 52 side than the N++ type field stop layer 57. The N++ type cathode layer 66 is connected to the collector electrode.

The diode region 20 may include the plurality of diodes 1*d* formed on the semiconductor substrate 50. For example, the diodes 1*d* are formed in the region 23 and the region 24. The diodes 1*d* may use the same trenches as those of the IGBTs 1*a*. In this case, each of the diodes 1*d* is formed by removing the N+ type barrier layer 54 and the N+ type emitter layer 56 from the configuration of the IGBT 1*a*. Hence, the diode 1*d* is formed by deactivating the configuration of the IGBT 1*a*. The N++ type cathode layer 66 is formed on the back surface 52, so that the configuration of the of the IGBT 1*a* can be operated as the diodes 1*d*.

The diode 1*d* has the N− type drift layer 53, the N− type semiconductor layer 53*a*, the P type channel layer 55, the pair of trench electrodes 60, the trench insulating film 65, the N+ type field stop layer 57, the N++ type cathode layer 66, and the P type floating layer 59.

The N− type drift layer 53 is provided more on the front surface 51 side than the N+ type field stop layer 57. The N− type drift layer 53 is provided over the IGBT region 10, the diode region 20 and the peripheral region 30.

The N− type semiconductor layer 53*a* is provided more on the front surface 51 side than the N− type drift layer 53. The N− type semiconductor layer 53*a* is disposed in an inside surrounded by the trench electrodes 60. When viewed from the front surface 51 side, the N− type semiconductor layer 53*a* extends in the Y-axis direction for example. The N− type semiconductor layer 53*a* may be one in which a part of the N− type drift layer 53 extends between the pair of trench electrodes 60. Hence, the N− type semiconductor layer 53*a* may have the same resistance value as that of the N− type drift layer 53. The N− type semiconductor layer 53*a* is sandwiched from both sides thereof in the X-axis direction by the pair of trench electrodes 60. That is, the N− type semiconductor layer 53*a* is disposed between the pair of trench electrodes 60.

The P type channel layer 55 is provided more on the front surface 51 side than the N− type semiconductor layer 53*a*. The P type channel layer 55 is disposed between the pair of trench electrodes 60. The P type channel layer 55 connects to the emitter electrode 41 loaded into the through hole that penetrates the insulating film 64.

The pair of trench electrodes 60 are provided so as to sandwich the N− type semiconductor layer 53*a* and the P type channel layer 55 from both sides in the X-axis direction. When viewed from the front surface 51 side, each of the trench electrodes 60 extends in the Y-axis direction for example. Similarly to the trench electrodes 62 of the IGBT 1*a*, the trench electrodes 60 may connect to the emitter electrode 41 loaded into the through hole that penetrates the insulating film 64. Accordingly, the pair of trench electrodes 60 of the diode 1*b* include two trench electrodes 62. The P type channel layer 55 and the trench electrodes 62 connect to the emitter electrode 41 loaded into the through hole that penetrates the insulating film 64. A structure between the pair of trench electrodes 60 is called an inter-trench structure. For example, the inter-trench structure of the diode 1*d* includes the N-type semiconductor layer 53*a* and the P type channel layer 55. The inter-trench structure of the diode 1*d* may include other members such as a contact layer.

The P type floating layer 59 is provided between the diodes 1*d* adjacent to each other in the plurality of diodes 1*d*. For example, the P type floating layer 59 is provided between the trench electrode 60 on the +X-axis direction side of the diode 1*d* on the −X-axis direction side and the trench electrode 60 on the −X-axis direction side of the diode 1*d* on the +X-axis direction side in the diodes 1*c* adjacent to each other. The P type floating layer 59 is provided on an opposite side to the N− type semiconductor layer 53*a* and the P type channel layer 55 while sandwiching the trench electrode 60 therewith.

The P type floating layer 59 is provided more on the front surface 51 side than the N− type drift layer 53. Hence, on the N− type drift layer 53, along the X-axis direction from the −X-axis direction side, there are arranged the P type floating layer 59, the trench electrode 60 (covered with the trench insulating film 65), the inter-trench structure, the trench electrode 60 (covered with the trench insulating film 65) and the P type floating layer 59. In a region in the diode region 20, in which the plurality of diodes 1*d* are arranged, such a configuration is arranged so as to be repeated in the X-axis direction.

The trench insulating film 65 is provided between the trench electrodes 60 and the N− type drift layer 53, the N− type semiconductor layer 53*a*, the P type channel layer 55 and the P type floating layer 59.

The N+ type field stop layer 57 is provided more on the back surface 52 side than the N− type drift layer 53. The N++ type cathode layer 66 is provided more on the back surface 52 side than the N+ type field stop layer 57. The N++ type cathode layer 66 is connected to the collector electrode.

Peripheral Region

The semiconductor substrate 50 of the peripheral region 30 has the N− type drift layer 53, the N+ type field stop layer 57, the N++ type cathode layer 66, and the P type floating layer 59. The P type floating layer 59 is provided more on the front surface 51 side than the N− type drift layer 53. The N+ type field stop layer 57 is provided more on the back surface 52 side than the N− type drift layer 53. The N++ type cathode layer 66 is provided more on the back surface 52 side than the N+ type field stop layer 57.

Figure 11:
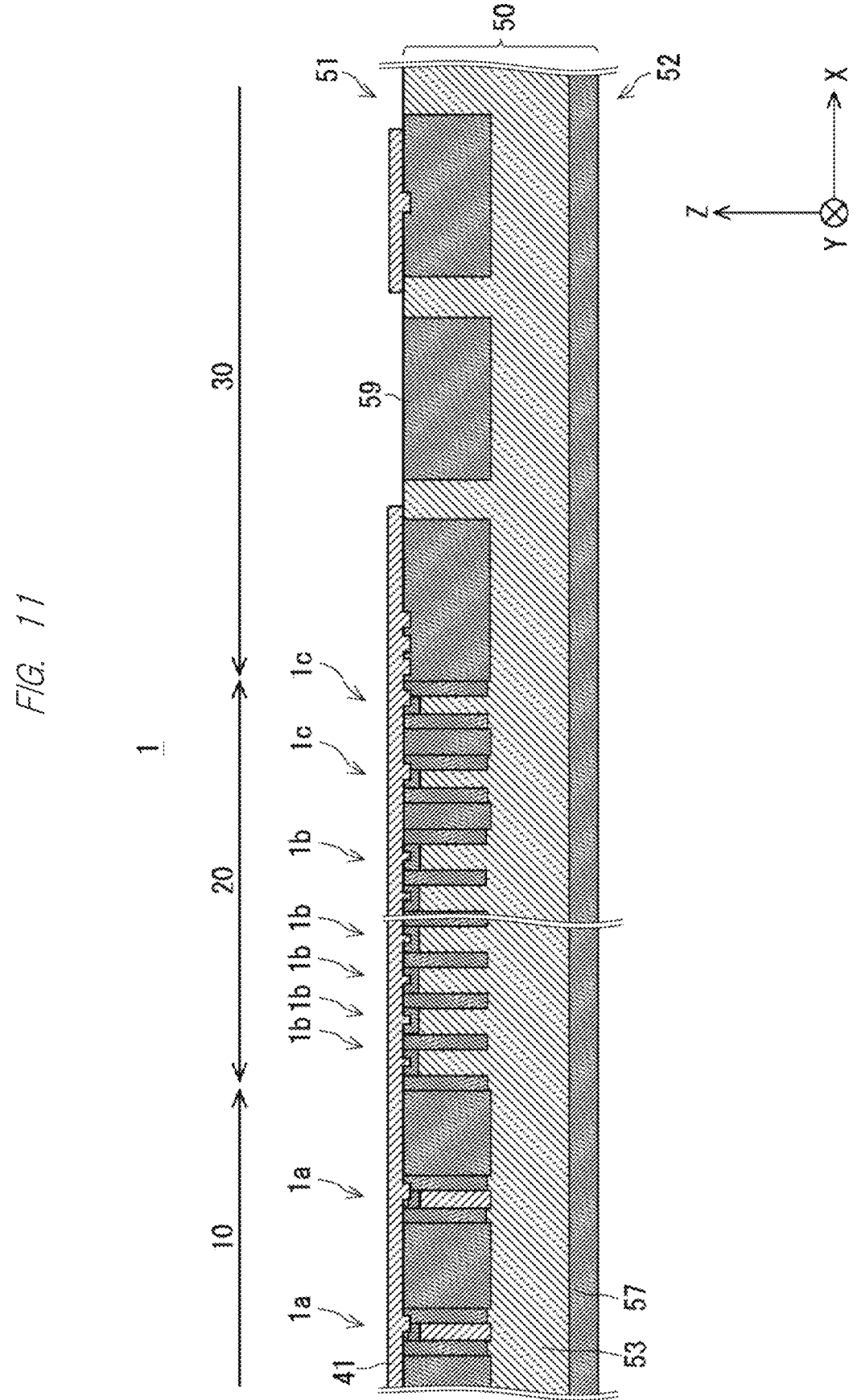
FIG. 11 is a cross-sectional view illustrating a method for forming an N++ type cathode layer and a P++ type collector layer on a back surface in the semiconductor device according to the first embodiment.
Figure 12:
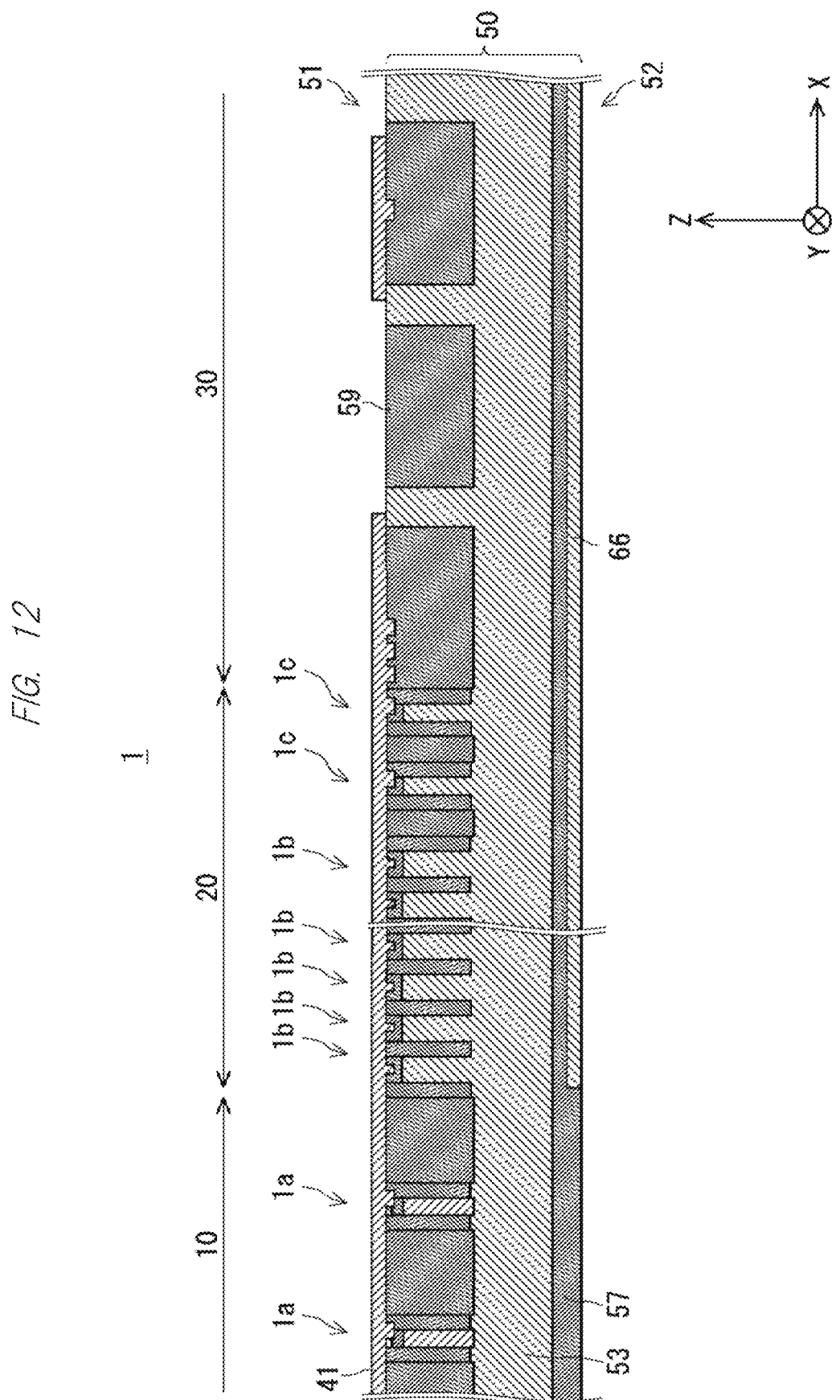
FIG. 12 is a cross-sectional view illustrating a method for forming the N++ type cathode layer and the P++ type collector layer on the back surface in the semiconductor device according to the first embodiment.

FIGS. 11 and 12 are cross-sectional views illustrating a method for forming the N++ type cathode layer 66 and the P++ type collector layer 58 on the back surface 52 in the semiconductor device 1 according to the first embodiment. As shown in FIG. 11, the N+ type field stop layer 57 is formed on the back surface 52 side of the semiconductor substrate 50. For example, the N+ type field stop layer 57 is formed by ion implantation.

Next, as shown in FIG. 12, on the back surface 52 of the diode region 20 and the back surface 52 of the peripheral region 30, the N++ cathode layer 66 is formed more on the back surface 52 side than the N+ type field stop layer 57 by the ion implantation and the like. Then, as shown in FIG. 5, on the back surface 52 of the IGBT region 10, the P++ type collector layer 58 is formed more on the back surface 52 side than the N+ type field stop layer 57 by the ion implantation and the like.

Figure 13:
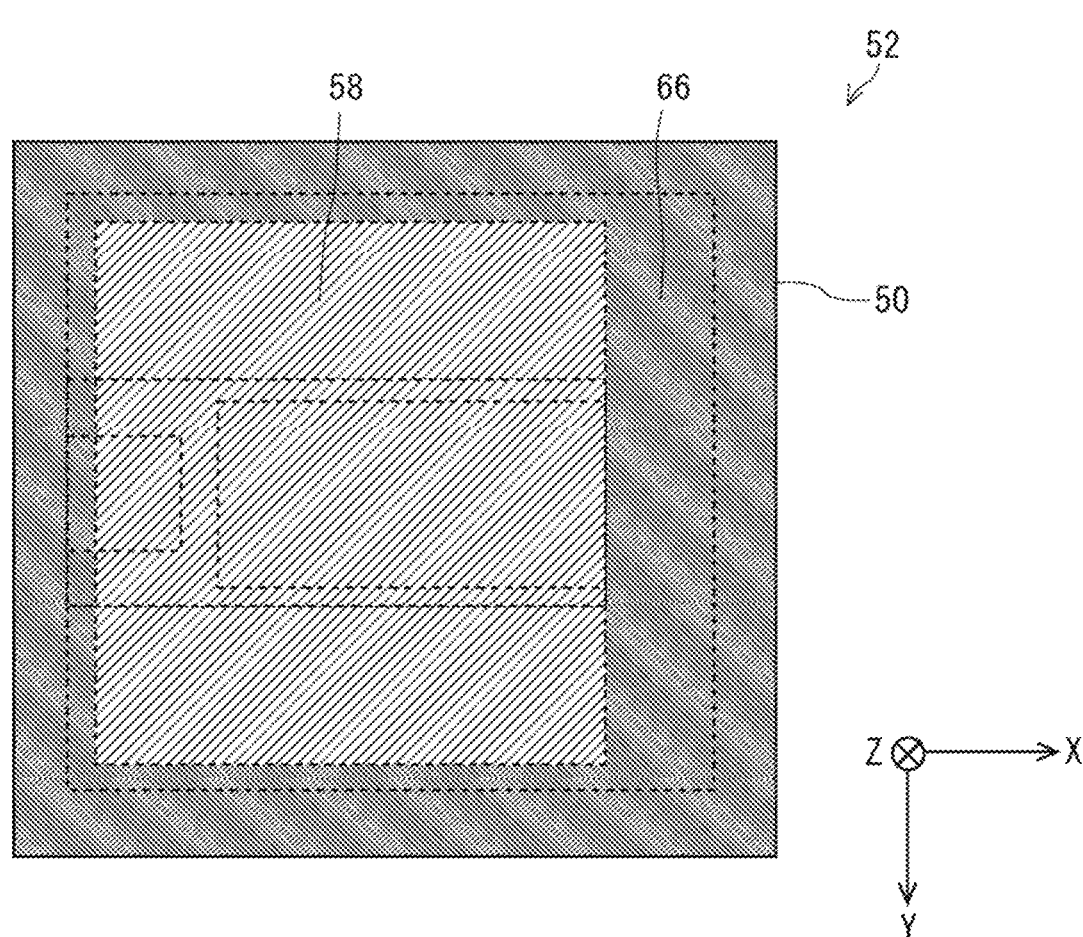
FIG. 13 is a plan view illustrating a back surface of a semiconductor substrate in the semiconductor device according to the first embodiment.

FIG. 13 is a plan view illustrating the back surface 52 of the semiconductor substrate 50 in the semiconductor device 1 according to the first embodiment. As shown in FIG. 13, the P++ type collector layer 58 is formed on the back surface 52 of the IGBT region 10. The N++ cathode layer 66 is formed on the back surface 52 of the diode region 20 and the back surface 52 of the peripheral region 30. When viewed from the back surface 52 side, the N++ cathode layer 66 is formed so as to surround the P++ type collector layer 58.

Next, effects of this embodiment will be described. The semiconductor device 1 of this embodiment has the diode region 20 between the IGBT region 10 and the Peripheral region 30. That is, the diode region 20 of the semiconductor device 1 is disposed in the form of being coupled to the peripheral region 30. Hence, in the semiconductor device 1, at the turning off time of the IGBTs 1a, each of the diodes 1bcd operates as a parasitic P-MOS. Thus, the semiconductor device 1 can enhance the effect of emitting the carriers such as the holes accumulated in the peripheral region 30. Hence, the local concentration of the carriers (a local concentration of currents) to the active end can be suppressed. Moreover, the diode region 20 can suppress the conductivity modulation at the time when the IGBTs 1a turn on, and can suppress the amount of carriers. Thus, the breakdown strength can be improved.

Moreover, the semiconductor device 1k has the N++ cathode layer 66 not only on the back surface 52 of the diode region 20 but also on the back surface 52 of the peripheral region 30. Accordingly, the semiconductor device 1 can suppress the formation of the parasitic pnp bipolar in the peripheral region 30. Hence, the semiconductor device 1 can suppress the leak current. Thus, the heat generation can be suppressed, and the breakdown strength can be improved. Meanwhile, at the time when the diodes 1bcd turn on, electrons are also supplied from the peripheral region 30. Thus, the semiconductor device 1 can reduce the forward voltage VF.

Moreover, the semiconductor device 1 increases the width of the portion in the diode region 20, which is distant from the gate electrode 40, more than the width of the portion therein, which is near the gate electrode 40. Hence, the gate wiring resistance can be reduced, and the gate delay can be reduced. Thus, the potential difference between the respective emitter pads can be suppressed.

Moreover, the semiconductor device 1 has a trench intermittent structure that has a share contact in the portion in which the diode region 20 and the peripheral region 30 are coupled to each other. That is, in the diode region 20, the plurality of square tube trench electrodes 68 are arranged while being separated from one another. Hence, the carriers can move between the square tube trench electrodes 68, and the local concentration of the carriers (the concentration of the currents) to the active end of the IGBT region 10 can be suppressed.

Second Embodiment

Figure 14:
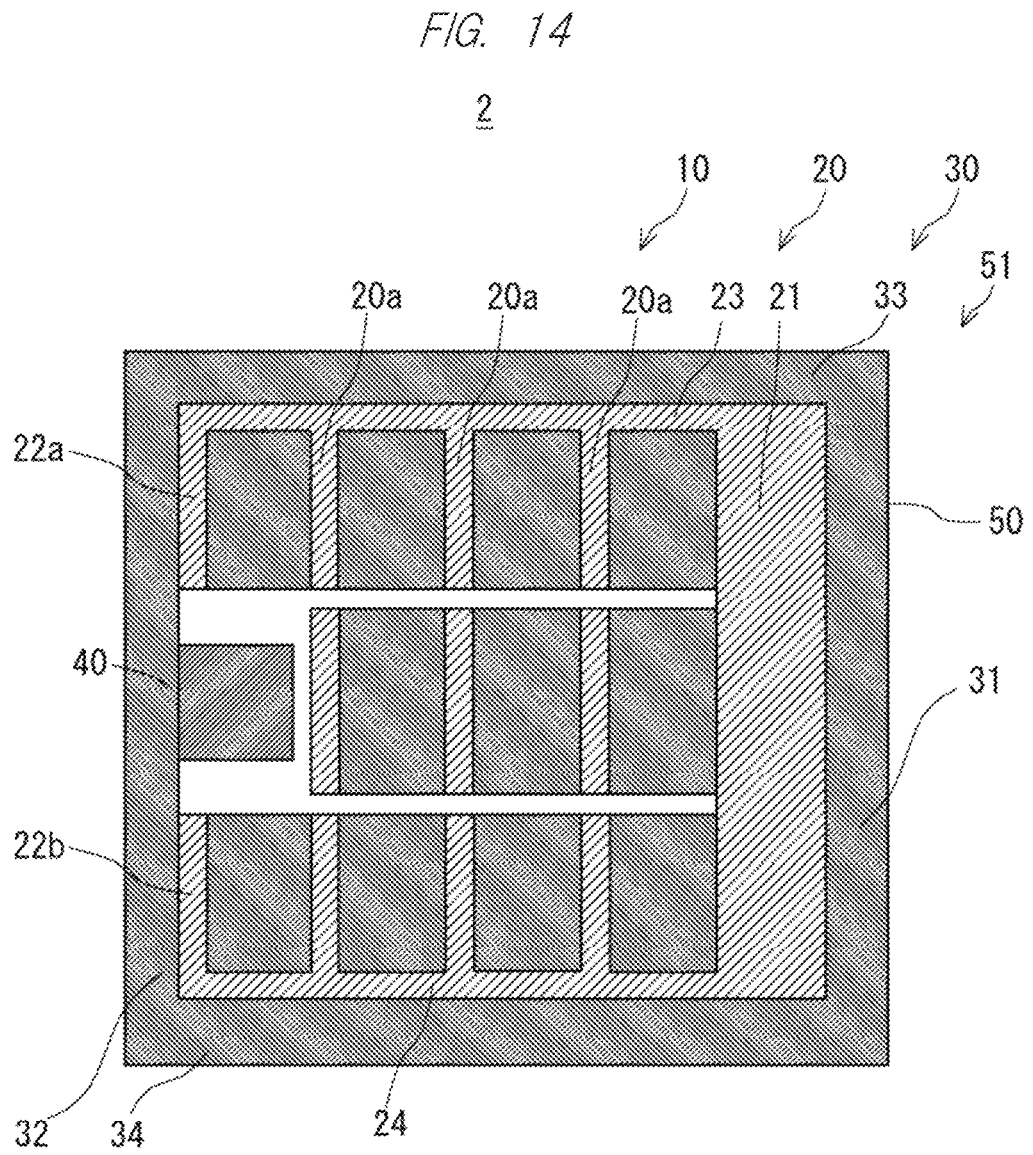
FIG. 14 is a plan view illustrating a front surface of a semiconductor substrate in a semiconductor device according to a second embodiment.
Figure 14:
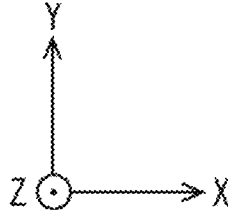
Figure 15:
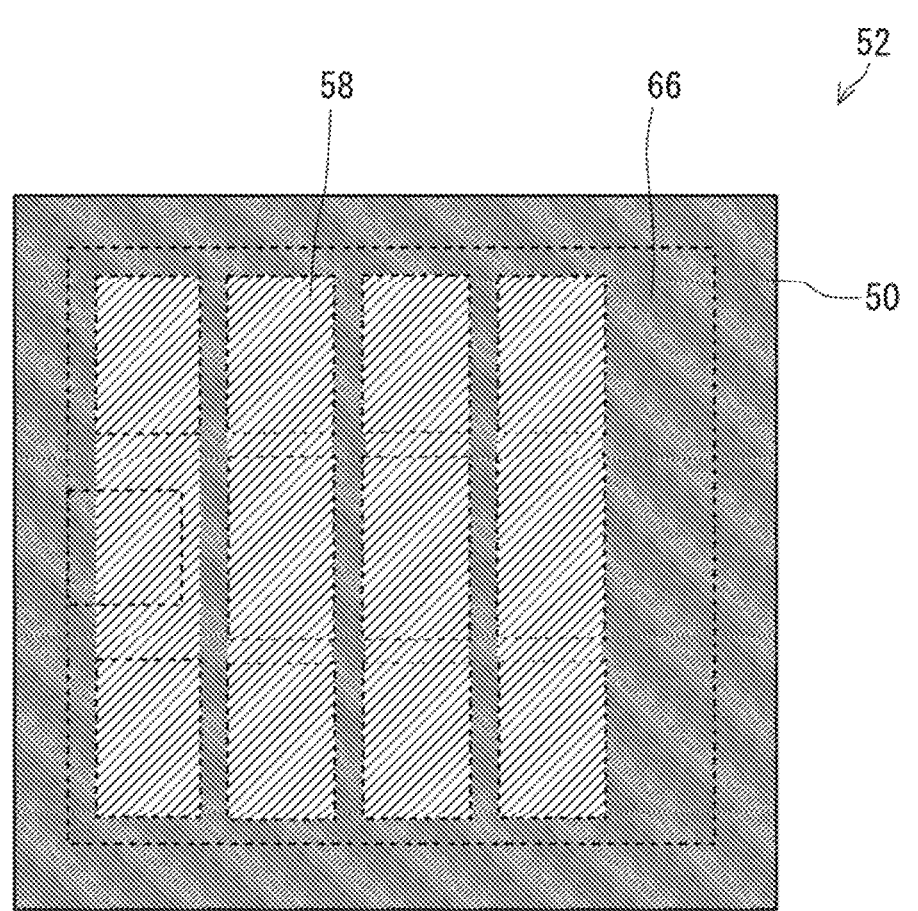
FIG. 15 is a plan view illustrating a back surface of the semiconductor substrate in the semiconductor device according to the second embodiment.
Figure 15:
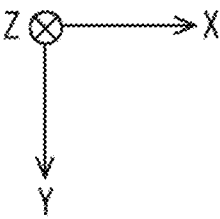

Next, a semiconductor device according to a second embodiment will be described. In the semiconductor device of this embodiment, a semiconductor substrate has an internal diode region disposed inside the IGBT region 10, which is surrounded by the diode region 20, so as to divide the IGBT region 10. FIG. 14 is a plan view illustrating a front surface of the semiconductor substrate in the semiconductor device according to the second embodiment. FIG. 15 is a plan view illustrating a back surface of the semiconductor substrate in the semiconductor device according to the second embodiment.

As shown in FIGS. 14 and 15, the semiconductor device 2 further has the internal diode region 20a. The internal diode region 20a is disposed inside the IGBT region 10 so as to divide the IGBT region 10. A plurality of the internal diode regions 20a may be disposed inside the IGBT region 10. The internal diode region 20a extends in the Y-axis direction. The internal diode region 20a connects to the diode region 20. Specifically, one end on the +Y-axis direction side of the internal diode region 20a connects to the region 23, and the other end on the −Y-axis direction side of the internal diode region 20a connects to the region 24.

The internal diode region 20a has a plurality of the diodes 1bcd provided therein. The plurality of diodes 1bcd may be at least any of the diodes 1b, the diodes 1c and the diodes 1d.

The diodes 1d can use similar trenches to those of the IGBTs 1a, and accordingly, manufacturing cost can be reduced.

According to this embodiment, at the time when the IGBTs 1a are turning on, the internal diode region 20a can suppress the conductivity modulation, and can suppress the amount of carriers, and therefore, can improve the breakdown strength. Other configurations and effects than this are included in the description of the first embodiment.

Third Embodiment

Figure 16:
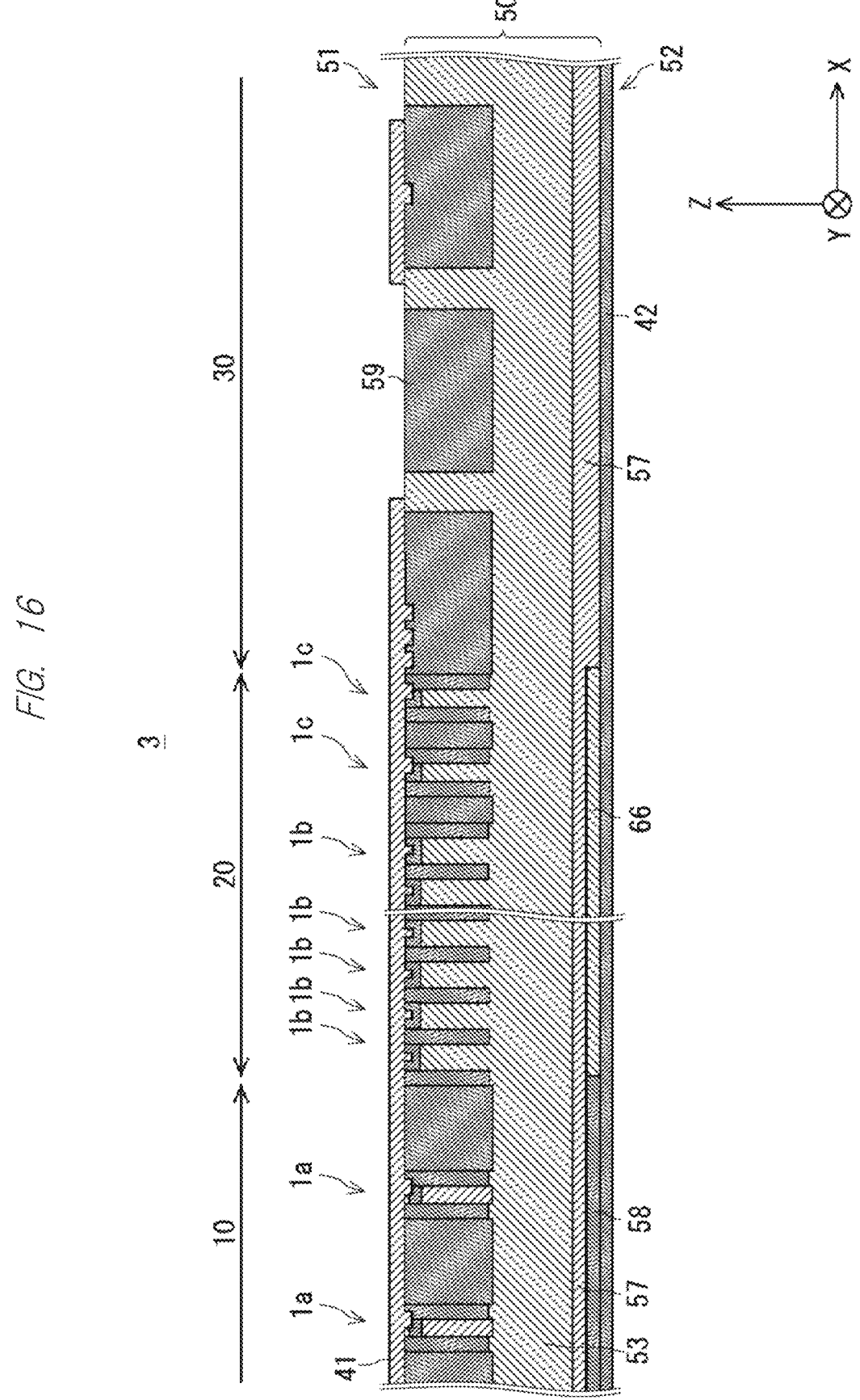
FIG. 16 is a cross-sectional view illustrating a semiconductor device according to a third embodiment, showing a cross section of a position similar to that along the line V-V of FIG. 4.

Next, a semiconductor device according to a third embodiment will be described. In the semiconductor device of this embodiment, the N++ cathode layer 66 is provided on the back surface 52 of the peripheral region 30. The N+ type field stop layer 57 is connected to the collector electrode. FIG. 16 is a cross-sectional view illustrating the semiconductor device according to the third embodiment, showing a cross section of a position similar to that along the line V-V of FIG. 4.

As shown in FIG. 16, in the semiconductor device 3 according to this embodiment, the semiconductor substrate 50 of the peripheral region 30 has the N-type drift layer 53, the N+ type field stop layer 57, and the P type floating layer 59. The P type floating layer 59 is provided more on the front surface 51 side than the N− type drift layer 53. The N+ type field stop layer 57 is provided more on the back surface 52 side than the N− type drift layer 53. The N+ type field stop layer is connected to the collector electrode 42.

According to this embodiment, the semiconductor substrate 50 in the peripheral region 30 forms a Schottky barrier with the collector electrode 42. Thus, a leak current due to holes, which flows from the collector electrode 42 to the emitter electrode 41, can be reduced. The Schottky barrier is formed on the back surface 52 of the peripheral region 30, so that carrier injection at the time of avalanche can be suppressed. Other configurations and effects than this are included in the descriptions of the first and second embodiments.

Fourth Embodiment

Figure 17:
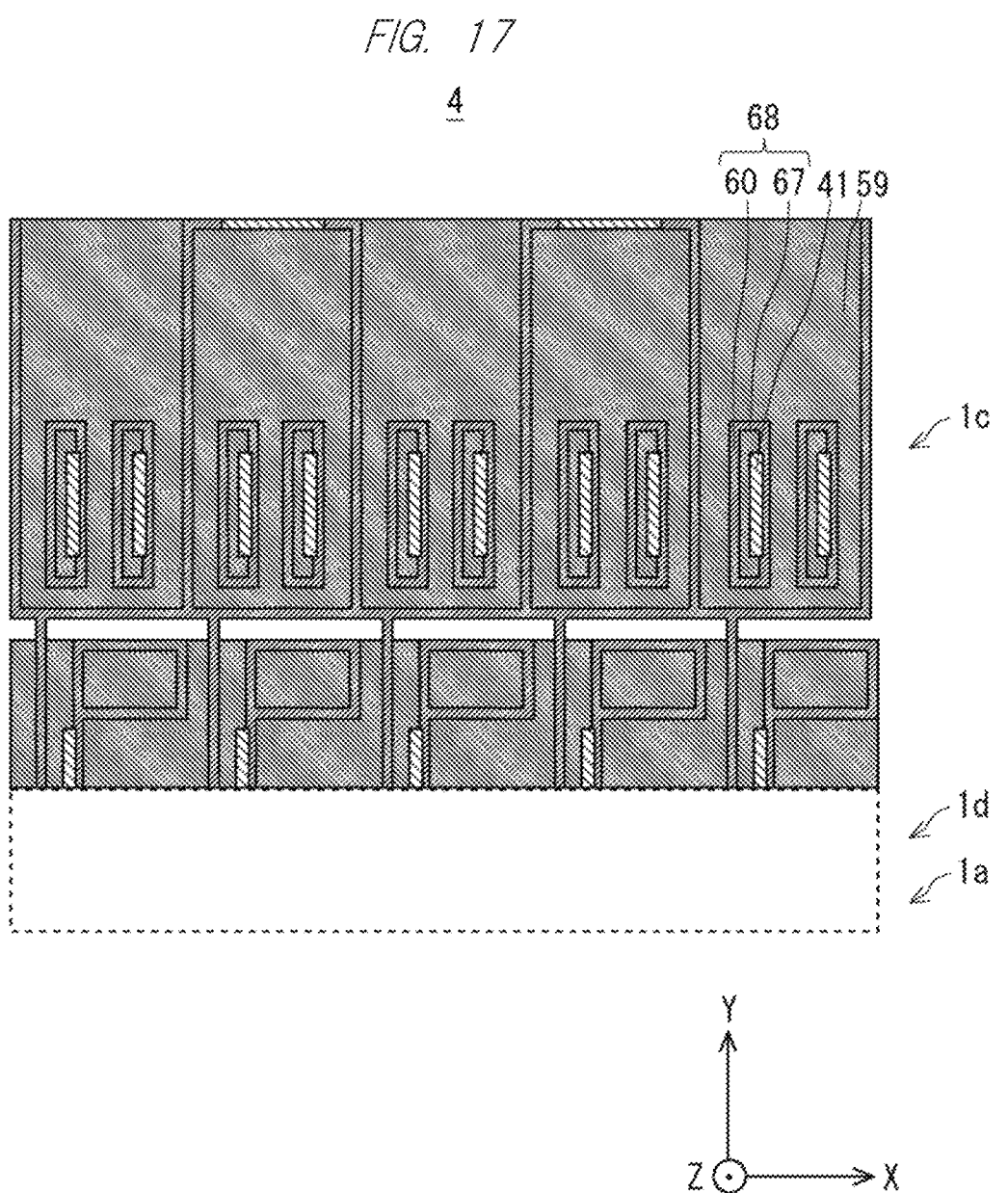
FIG. 17 is a plan view illustrating a semiconductor device according to a forth embodiment, showing a plane of a position similar to that along the line VII-VII of FIG. 4.

Next, a semiconductor device according to a fourth embodiment will be described. In the region 21 on the X-axis direction side in the diode region 20, the semiconductor device 1 of the above-mentioned first embodiment include the plurality of diodes 1c in the junctions with the peripheral region 30. Each of the diodes 1c has the trench intermittent structure that has the share contact. Moreover, in the regions 23 and 24 on the Y-axis direction side in the diode region 20, the semiconductor device 1 of the above-mentioned first embodiment includes the plurality of diodes 1d which use the same trenches as those of the IGBTs 1a. In contrast, the semiconductor device of this embodiment includes the diodes 1c in the region 23 and the region 24 in the diode region 20. FIG. 17 is a plan view illustrating the semiconductor device according to the forth embodiment, showing a plane of a position similar to that along the line VII-VII of FIG. 4.

As shown in FIG. 17, in the semiconductor device 4 of this embodiment, the region 23 and the region 24 in the diode region 20 include the plurality of diodes 1c. As described above, this embodiment has a structure in which the trench intermittent structures having the share contacts are additionally provided to the regions 23 and 24. In a region of FIG. 17, which is surrounded by a dotted line, such configurations shown in FIG. 7 are arrayed.

According to this embodiment, both of the regions 23 and 24 include the plurality of diodes 1c each having the trench intermittent structure that has the share contact, and accordingly, the carriers can move between the diodes 1c, and the local concentration of the carriers (the local concentration of the current) to the active end of the IGBT region 10 can be suppressed. Other configurations and effects than this are included in the description of the first to third embodiments.

Fifth Embodiment

Figure 18:
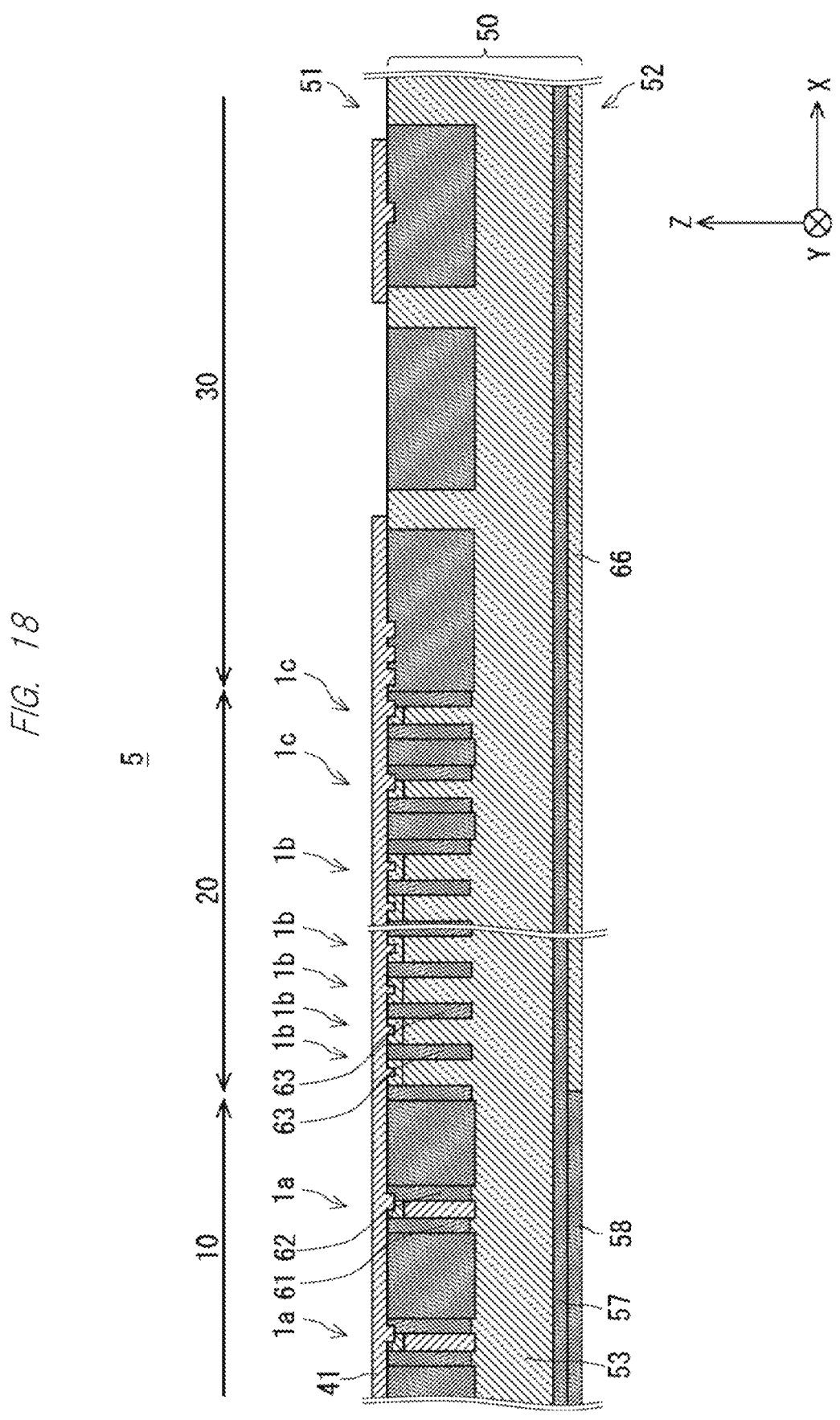
FIG. 18 is a cross-sectional view illustrating a semiconductor device according to a fifth embodiment, showing a cross section of a position similar to that along the line V-V of FIG. 4.
Figure 19:
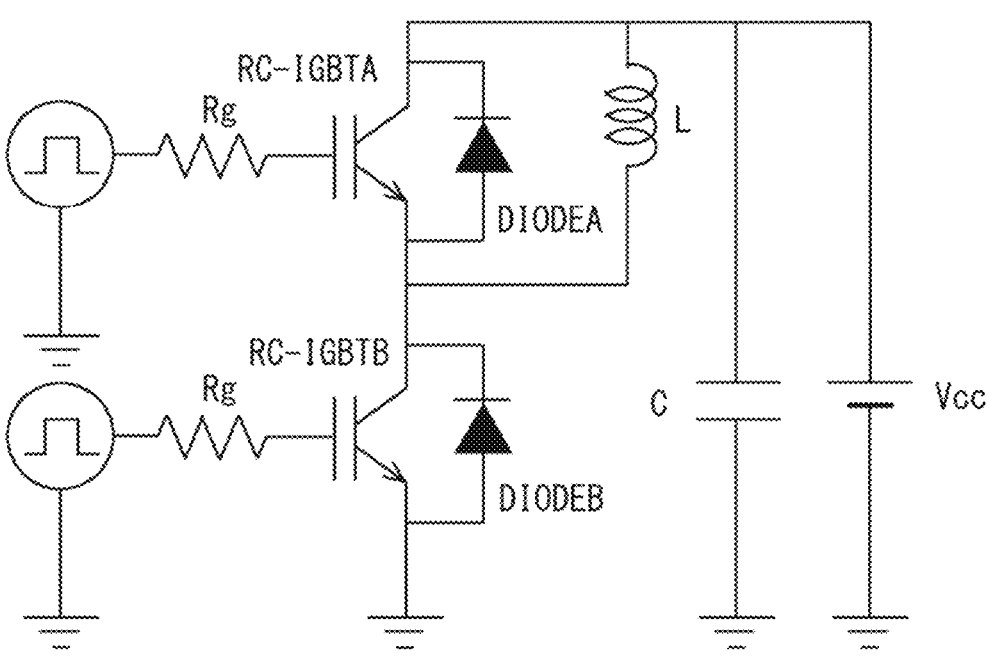
FIG. 19 is a circuit diagram illustrating connections of RC-IGBTs in the semiconductor device according to the fifth embodiment.
Figure 20:
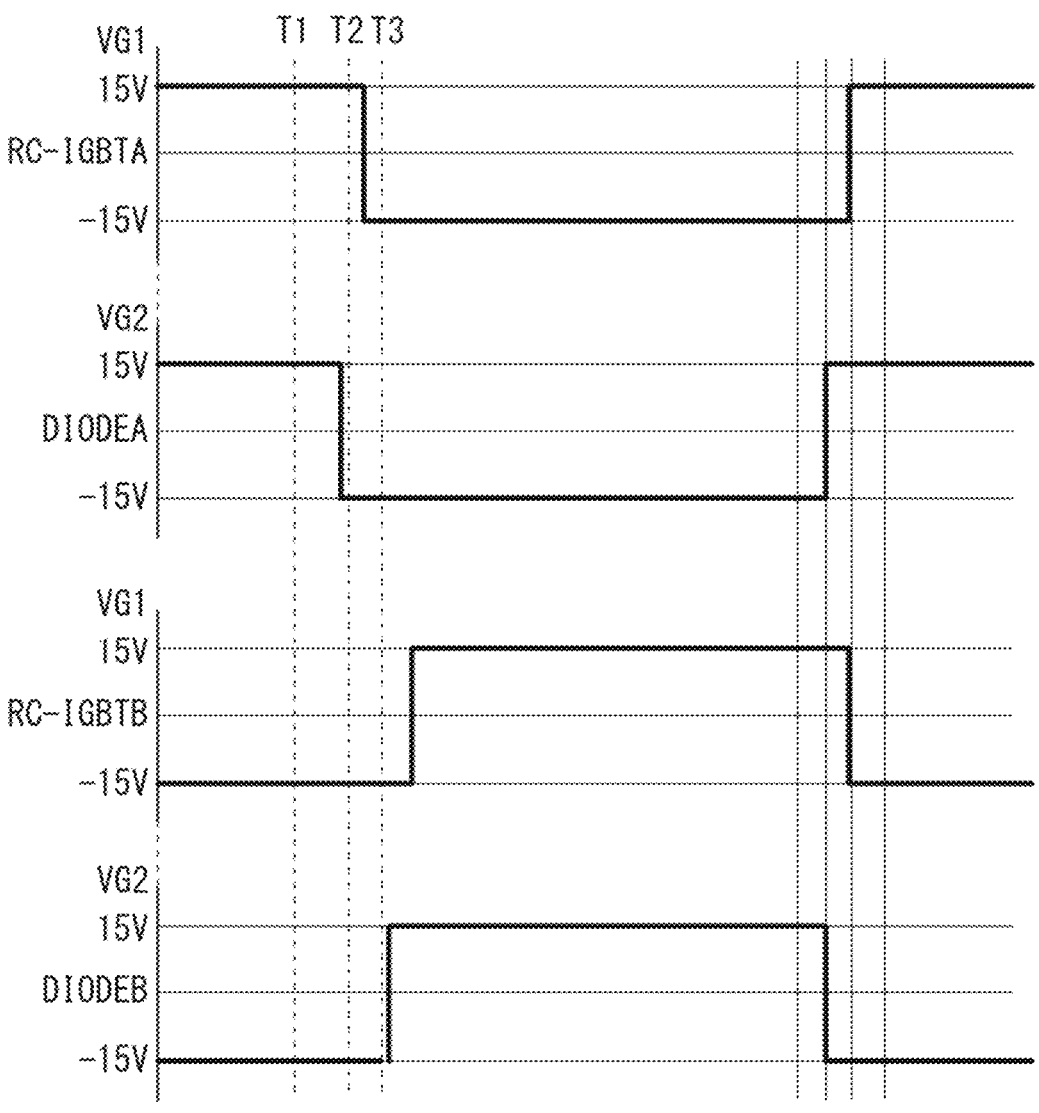
FIG. 20 is a graph illustrating voltages of trench electrodes of IGBTs and of trench electrodes of diodes in the semiconductor device according to the fifth embodiment, where a horizontal axis represents a time and a vertical axis represents the voltages.
Figure 21:
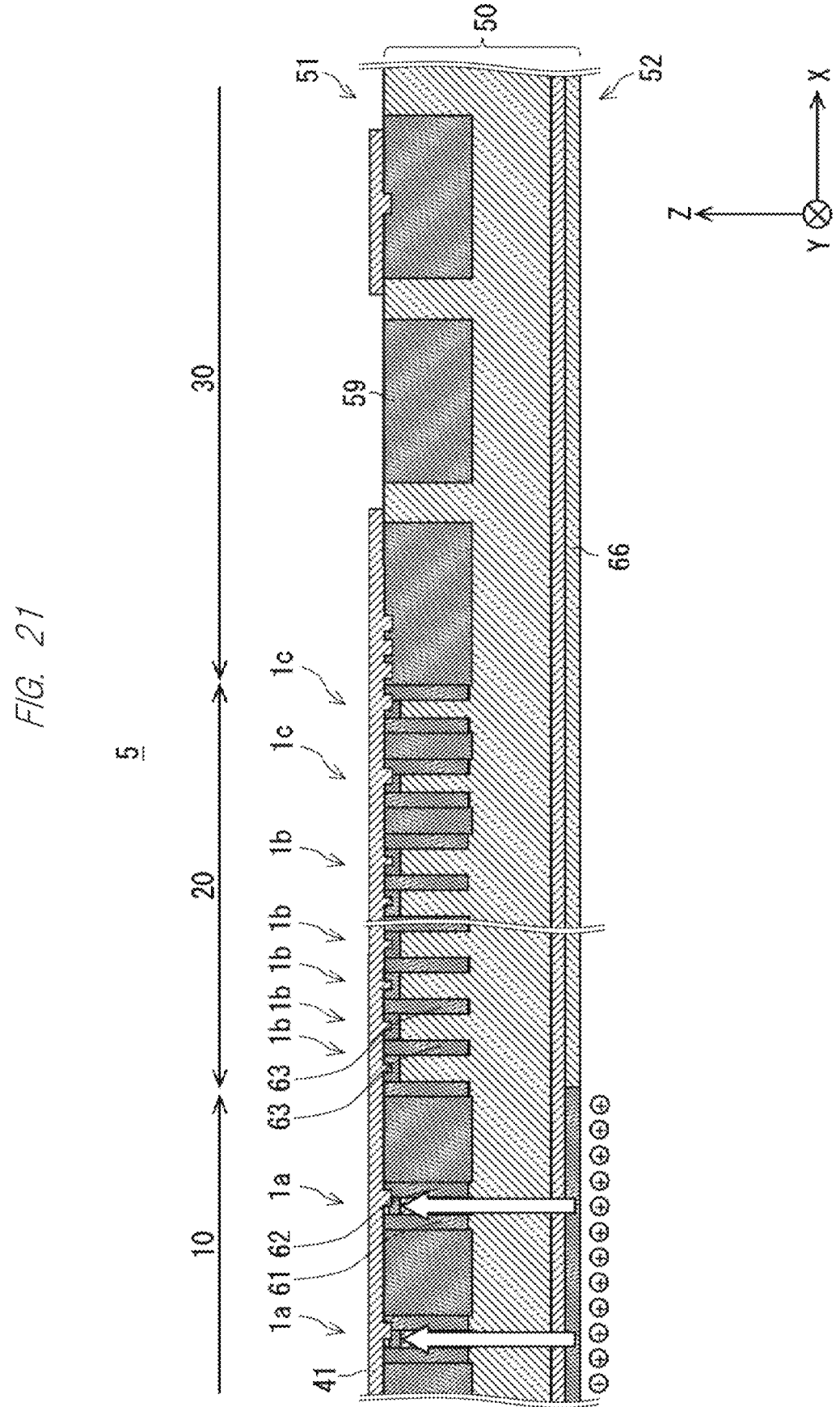
FIG. 21 is a diagram illustrating emissions of carriers in the semiconductor device according to the fifth embodiment.
Figure 22:
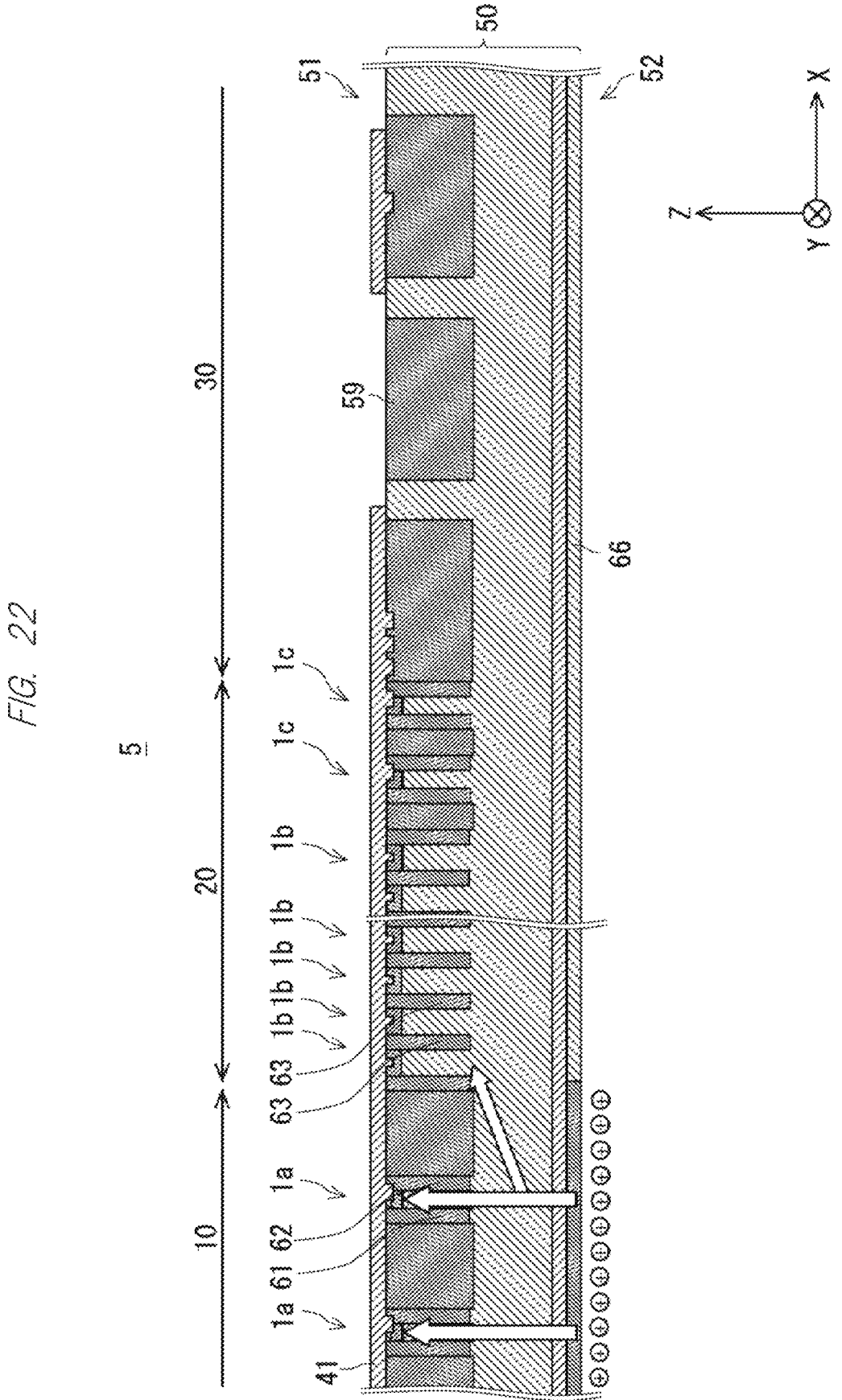
FIG. 22 is a diagram illustrating the emissions of the carriers in the semiconductor device according to the fifth embodiment.
Figure 23:
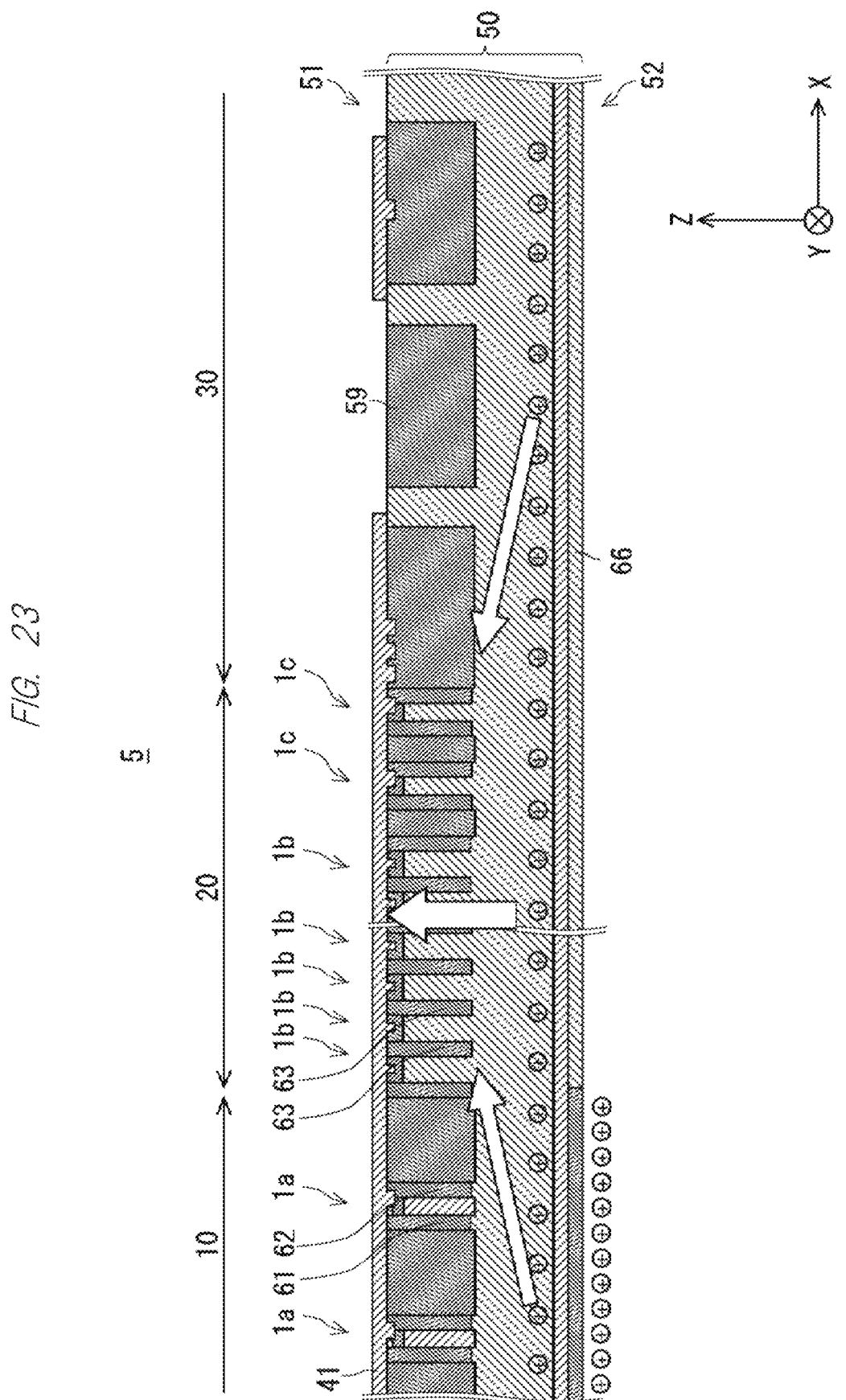
FIG. 23 is a diagram illustrating the emissions of the carriers in the semiconductor device according to the fifth embodiment.

Next, a semiconductor device according to a fifth embodiment will be described. The semiconductor device of this embodiment controls the trench electrode 60 of each of the diodes 1b as a second gate different from the gate of the IGBT 1a. FIG. 18 is a cross-sectional view illustrating the semiconductor device according to the fifth embodiment, showing a cross section of a position similar to that along the line V-V of FIG. 4. FIG. 19 is a circuit diagram illustrating connections of RC-IGBTs in the semiconductor device according to the fifth embodiment. FIG. 20 is a graph illustrating voltages of the trench electrodes 61 of the IGBTs 1a and of the trench electrodes 63 of the diodes 1b in the semiconductor device according to the fifth embodiment, where a horizontal axis represents a time and a vertical axis represents the voltages. FIGS. 21 to 23 are diagrams illustrating emissions of the carriers in the semiconductor device according to the fifth embodiment.

As shown in FIG. 18, in the semiconductor device 5 of this embodiment, a pair of the trench electrodes 60 of each of the IGBTs 1a includes the trench electrode 61 and the trench electrode 62. The trench electrode 61 connects to the gate electrode 40 with a gate wiring (not shown) interposed therebetween. The N+ type emitter layer 56, the P type channel layer 55 and the trench electrode 62 connect to the emitter electrode 41 with an emitter wiring interposed therebetween. The diode 1b includes two trench electrodes 60. Each trench electrode 60 connects to another gate electrode, which is different from the gate electrode 40, with another gate wiring interposed therebetween. The trench electrode 60 that connects to another gate electrode is called a trench electrode 63. Hence, the pair of trench electrodes 60 in the plurality of diodes 1b include two trench electrodes 63.

As shown in FIG. 19, for example, the semiconductor device 5 has an RC-IGBT A and an RC-IGBT B. The RC-IGBT A has the IBGT 1a and the diode 1b. The diodes 1b of the RC-IGBT A is called a DIODE A. The RC-IGBT B has the IBGT 1a and the diode 1b. The diodes 1b of the RC-IGBT B is called a DIODE B.

As shown in an upper part of FIG. 20, in the RC-IGBT A, a negative voltage is applied to the trench electrode 63 (called VG2) of the DIODE A, and thereafter, a negative voltage is applied to the trench electrode 61 (called VG1) of the IGBT 1a. Specifically, a negative voltage is applied to the trench electrode 63 immediately before the IGBT 1a turns off. As described above, a negative voltage is applied to the trench electrode 63 immediately before the IGBT 1a turns off, so that the effect of sweeping out carriers can be improved. Hence, the breakdown strength of the IGBT 1a can be improved. Moreover, the forward voltage VF can be reduced.

Further, after a positive voltage is applied to the trench electrode 63. a positive voltage is applied to the trench electrode 61. Specifically, a positive voltage is applied to the trench electrode 63 immediately before the IGBT 1a turns on. As described above, a positive voltage is applied to the trench electrode 63 immediately before the IGBT 1a turns on, so that a reverse recovery loss Err can be reduced, and the diode performance can be improved. The RC-IGBT B performs similar operations to those of the RC-IGBT A though timing thereof differs.

Operations of the RC-IGBT A at respective pieces of time T1 to time T3 in FIG. 20 will be described with reference to the drawing. As shown in FIG. 20, when a positive voltage is applied to the trench electrode 63 (VG2) at time T1, then as shown in FIG. 21, a parasitic P-MOS of the diode 1b (DIODE A) is off. Hence, the diode 1b (DIODE A) is subjected to the suppression of the carrier emission.

As shown in FIG. 20, when a negative voltage is applied to the trench electrode 63 (VG2) at time T2, then as shown in FIG. 22, the parasitic P-MOS of the diode 1b (DIODE A) turns on. Hence, the diode 1b (DIODE A) starts to emit the carriers.

As shown in FIG. 20, when the IGBT 1a (RC-IGBT A) turns off at time T3, then as shown in FIG. 23, the carrier injection from the back surface 52 stops. The accumulated carriers are emitted through the parasitic P-MOS of the diode 1b (DIODE A).

According to this embodiment, a negative voltage is applied to the trench electrode 63 when the IGBT 1a turns off, so that the effect of sweeping out the carriers can be improved. Hence, the breakdown strength of the IGBT 1a can be improved. Moreover, the forward voltage VF can be reduced. Meanwhile, a positive voltage is applied to the trench electrode 63 immediately before the IGBT 1a turns on, so that the carrier emission effect can be suppressed, and the reverse recovery loss Err can be reduced. Other configurations and effects than this are included in the description of the first to fourth embodiments.

Sixth Embodiment

Figure 24:
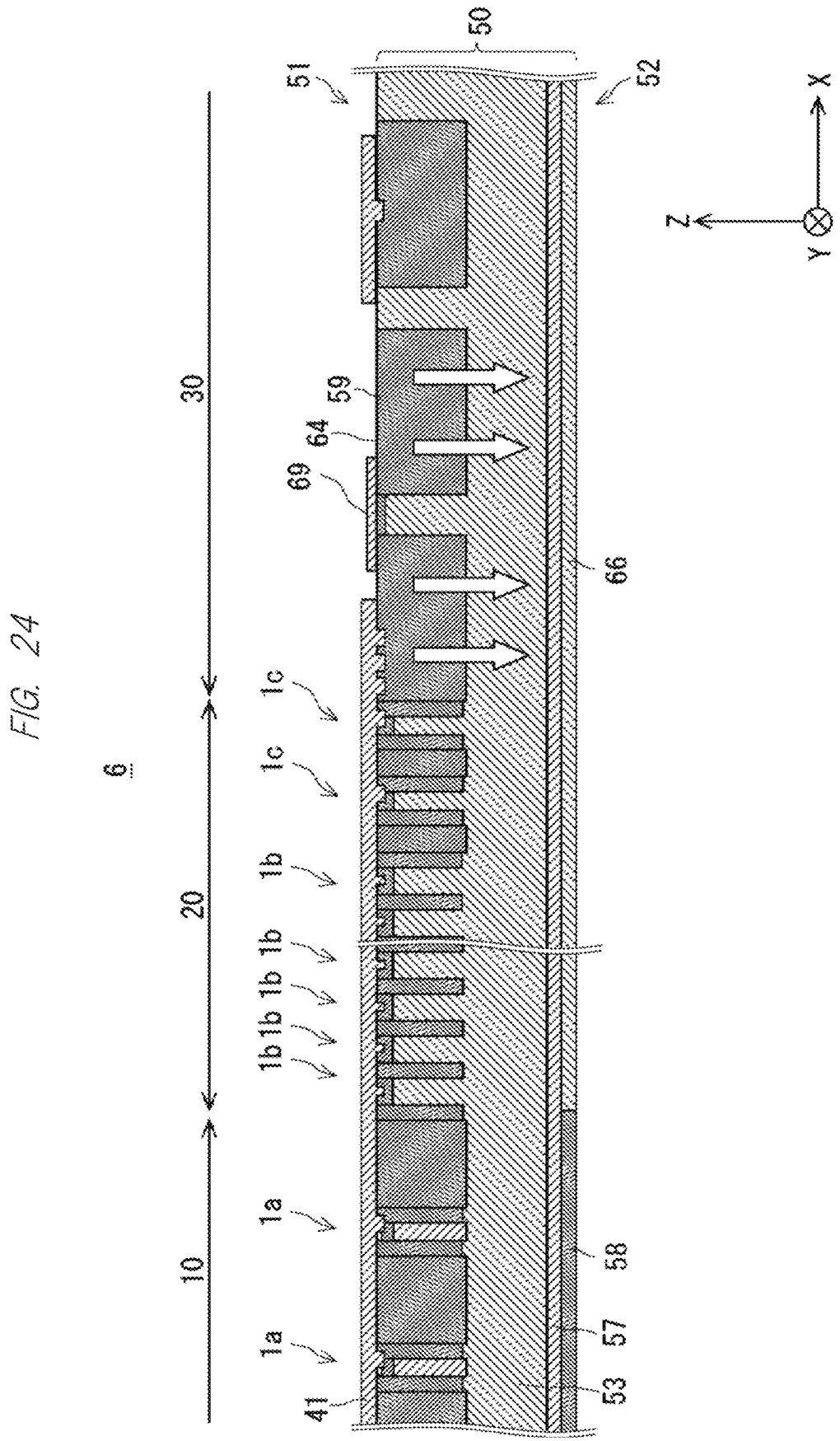
FIG. 24 is a cross-sectional view illustrating a semiconductor substrate of a peripheral region in a semiconductor device according to a sixth embodiment.

Next, a semiconductor device according to a sixth embodiment will be described. The semiconductor device of this embodiment has a planar gate in the peripheral region 30. FIG. 24 is a cross-sectional view illustrating a semiconductor substrate of the peripheral region in the semiconductor device according to the sixth embodiment.

As shown in FIG. 24, in the semiconductor device 6 of this embodiment, the semiconductor substrate 50 of the peripheral region 30 has the N− type drift layer 53, a plurality of the P type floating layers 59, the insulating film 64, the planar gate 69, the N+ type field stop layer 57, and the N++ type cathode layer 66.

The plurality of P type floating layers 59 are provided on the N− type drift layer 53. The plurality of P type floating layers 59 are provided so as to sandwich a part the N− type drift layer 53 in the X-axis direction. The insulating film 64 is provided on the N− type drift layer 53 and the P type floating layers 59 adjacent thereto.

The planar gate 69 is provided on the N− type drift layer 53 and the thus adjacent P type floating layers 59 with the insulating film 64 interposed therebetween. The N+ type field stop layer 57 is provided more on the back surface 52 side than the N− type drift layer 53. The N++ type cathode layer 66 is provided more on the back surface 52 side than the N+ type field stop layer 57.

The semiconductor device 6 of this embodiment applies a negative voltage to the planar gate 69 in the case of turning off the IGBT 1a. A negative voltage is applied to the planar gate 69, so that the holes also flow from a path that passes via the P type floating layers 59. Therefore, the anode region expands, and the forward voltage VF can be reduced.

According to this embodiment, a negative voltage can be applied to the planar gate 69 when the IGBT 1*a* turns off, and therefore, the accumulated carriers can also be emitted from the path that passes via the P type floating layers 59. Hence, such a carrier emission effect can be improved. Other configurations and effects than this are included in the description of the first to fifth embodiments.

While the invention made by the inventor thereof has been specifically described on the basis of the embodiments thereof, needless to say, the present invention is not limited to the above-described embodiments, and is modifiable in various ways within the scope without departing from the spirit thereof. Moreover, those obtained by combining the respective configurations of the first to sixth embodiments with one another belong to the scope of the technical idea.

What is claimed is:

1. A semiconductor device comprising:
a semiconductor substrate having a first main surface and a second main surface opposite to the first main surface,
wherein, when viewed from a first main surface side, the semiconductor substrate includes:
an IGBT region including a plurality of IGBTs formed on the semiconductor substrate;
a diode region disposed to surround the IGBT region and including a plurality of diodes formed on the semiconductor substrate; and
a peripheral region disposed to surround the diode region,
wherein the IGBT includes:
a first conductive type drift layer;
a first conductive type barrier layer provided more on the first main surface side than the drift layer;
a second conductive type channel layer provided more on the first main surface side than the barrier layer;
a first conductive type emitter layer provided more on the first main surface side than the channel layer;
a pair of trench electrodes provided to sandwich the barrier layer, the channel layer and the emitter layer from both sides in one direction in a plane parallel to the first main surface;
a trench insulating film provided between the trench electrodes and the drift layer, the barrier layer, the channel layer and the emitter layer;
a first conductive type field stop layer provided more on a second main surface side than the drift layer; and
a second conductive type collector layer provided more on the second main surface side than the field stop layer, and
wherein the diode includes:
the first conductive type drift layer;
a first conductive type semiconductor layer provided more on the first main surface side than the drift layer;
the second conductive type channel layer provided more on the first main surface side than the semiconductor layer;
the pair of trench electrodes provided to sandwich the semiconductor layer and the channel layer from both sides in the one direction;
the trench insulating film provided between the trench electrodes and the drift layer, the semiconductor layer and channel layer;
the first conductive type field stop layer provided more on the second main surface side than the drift layer; and
a first conductive type cathode layer provided more on the second main surface side than the field stop layer, wherein, when viewed from the first main surface side, the diode region includes:
a first portion disposed between the peripheral region and one end in the one direction of the IGBT region;
a second portion disposed between the peripheral region and other end in the one direction of the IGBT region;
a third portion disposed between the peripheral region and one end in other direction intersecting the one direction of the IGBT region; and
a fourth portion disposed between the peripheral region and other end in the other direction of the IGBT region,
wherein the semiconductor device further comprises:
an emitter electrode provided on the first main surface with an insulating film interposed between the emitter electrode and the first main surface;
a gate electrode provided on the first main surface with the insulating film interposed between the gate electrode and the first main surface, and disposed more on the other end side in the one direction than the IGBT region; and
a collector electrode provided on the second main surface, and
wherein a width of the first portion that separates the IGBT region and the peripheral region from each other in the one direction is larger than a width of the second portion that separates the IGBT region and the peripheral region from each other in the one direction.

2. The semiconductor device according to claim 1, wherein a width of the first portion that separates the IGBT region and the peripheral region from each other in the one direction is larger than a width of the third portion that separates the IGBT region and the peripheral region from each other in the other direction.

3. The semiconductor device according to claim 1, wherein the pair of trench electrodes of the IGBT include a first trench electrode and a second trench electrode, wherein the pair of trench electrodes of the diode include the two second trench electrodes, wherein the first trench electrode connects to the gate electrode, and wherein the emitter layer, the channel layer and the second trench electrode connect to the emitter electrode.

4. The semiconductor device according to claim 1, wherein the diode region includes a plurality of other diodes formed on the semiconductor substrate, wherein the other diodes include:
the drift layer;
the first conductive type semiconductor layer provided more on the first main surface side than the drift layer;
the second conductive type channel layer provided more on the first main surface side than the semiconductor layer;
a square tube trench electrode having a square tube shape, the square tube trench electrode being provided to sandwich the semiconductor layer and the channel layer from both sides in the one direction and to sandwich the semiconductor layer and the channel layer from both sides in other direction intersecting the one direction;
the trench insulating film provided between the square tube trench electrode and the drift layer, the semiconductor layer and channel layer;

the first conductive type field stop layer provided more on the second main surface side than the drift layer; and the first conductive type cathode layer provided more on the second main surface side than the field stop layer, wherein the pair of trench electrodes of the IGBT include a first trench electrode and a second trench electrode, wherein the first trench electrode connects to the gate electrode, and wherein the emitter layer, the channel layer, the second trench electrode and the square tube trench electrode connect to the emitter electrode.

5. The semiconductor device according to claim 4, wherein the IGBT further includes a second conductive type floating layer provided on an opposite side to the barrier layer, the channel layer and the emitter layer with the trench electrode sandwiched between the floating layer and the barrier layer, the channel layer and the emitter layer, and wherein the other diodes further include the second conductive type floating layer provided on an opposite side to the semiconductor layer and the channel layer with the square tube trench electrode sandwiched between the floating layer and the semiconductor layer and the channel layer.

6. The semiconductor device according to claim 5, wherein the floating layer between the floating layer on one end in the one direction of the IGBT region and the floating layer on other end in the one direction is in contact with the first trench electrode and the second trench electrode.

7. A semiconductor device, comprising:

a semiconductor substrate having a first main surface and a second main surface opposite to the first main surface, wherein, when viewed from a first main surface side, the semiconductor substrate includes:

an IGBT region including a plurality of IGBTs formed on the semiconductor substrate;

a diode region disposed to surround the IGBT region and including a plurality of diodes formed on the semiconductor substrate; and a peripheral region disposed to surround the diode region, wherein the IGBT includes:

a first conductive type drift layer;

a first conductive type barrier layer provided more on the first main surface side than the drift layer;

a second conductive type channel layer provided more on the first main surface side than the barrier layer;

a first conductive type emitter layer provided more on the first main surface side than the channel layer;

a pair of trench electrodes provided to sandwich the barrier layer, the channel layer and the emitter layer from both sides in one direction in a plane parallel to the first main surface;

a trench insulating film provided between the trench electrodes and the drift layer, the barrier layer, the channel layer and the emitter layer;

a first conductive type field stop layer provided more on a second main surface side than the drift layer; and a second conductive type collector layer provided more on the second main surface side than the field stop layer, and wherein the diode includes:

the first conductive type drift layer;

a first conductive type semiconductor layer provided more on the first main surface side than the drift layer;

the second conductive type channel layer provided more on the first main surface side than the semiconductor layer;

the pair of trench electrodes provided to sandwich the semiconductor layer and the channel layer from both sides in the one direction;

the trench insulating film provided between the trench electrodes and the drift layer, the semiconductor layer and channel layer;

the first conductive type field stop layer provided more on the second main surface side than the drift layer; and a first conductive type cathode layer provided more on the second main surface side than the field stop layer, wherein the diode region includes a plurality of other diodes formed on the semiconductor substrate, wherein the other diodes include:

the drift layer;

the first conductive type semiconductor layer provided more on the first main surface side than the drift layer;

the second conductive type channel layer provided more on the first main surface side than the semiconductor layer;

a square tube trench electrode having a square tube shape, the square tube trench electrode being provided to sandwich the semiconductor layer and the channel layer from both sides in the one direction and to sandwich the semiconductor layer and the channel layer from both sides in other direction intersecting the one direction;

the trench insulating film provided between the square tube trench electrode and the drift layer, the semiconductor layer and channel layer;

the first conductive type field stop layer provided more on the second main surface side than the drift layer; and the first conductive type cathode layer provided more on the second main surface side than the field stop layer, wherein, when viewed from the first main surface side, the diode region includes:

a first portion disposed between the peripheral region and one end in the one direction of the IGBT region;

a second portion disposed between the peripheral region and other end in the one direction of the IGBT region;

a third portion disposed between the peripheral region and one end in other direction intersecting the one direction of the IGBT region; and a fourth portion disposed between the peripheral region and other end in the other direction of the IGBT region, and wherein at least any of the third portion and the fourth portion includes the other diode.

8. A semiconductor device comprising:

a semiconductor substrate having a first main surface and a second main surface opposite to the first main surface, wherein, when viewed from a first main surface side, the semiconductor substrate includes:

an IGBT region including a plurality of IGBTs formed on the semiconductor substrate;

a diode region disposed to surround the IGBT region and including a plurality of diodes formed on the semiconductor substrate; and a peripheral region disposed to surround the diode region, wherein the IGBT includes:

a first conductive type drift layer;

a first conductive type barrier layer provided more on the first main surface side than the drift layer;

a second conductive type channel layer provided more on the first main surface side than the barrier layer;

a first conductive type emitter layer provided more on the first main surface side than the channel layer;

a pair of trench electrodes provided to sandwich the barrier layer, the channel layer and the emitter layer from both sides in one direction in a plane parallel to the first main surface;

a trench insulating film provided between the trench electrodes and the drift layer, the barrier layer, the channel layer and the emitter layer;

a first conductive type field stop layer provided more on a second main surface side than the drift layer; and a second conductive type collector layer provided more on the second main surface side than the field stop layer, and wherein the diode includes:

the first conductive type drift layer;

a first conductive type semiconductor layer provided more on the first main surface side than the drift layer;

the second conductive type channel layer provided more on the first main surface side than the semiconductor layer;

the pair of trench electrodes provided to sandwich the semiconductor layer and the channel layer from both sides in the one direction;

the trench insulating film provided between the trench electrodes and the drift layer, the semiconductor layer and channel layer;

the first conductive type field stop layer provided more on the second main surface side than the drift layer; and a first conductive type cathode layer provided more on the second main surface side than the field stop layer, wherein the semiconductor device further comprises:

an emitter electrode provided on the first main surface with an insulating film interposed between the emitter electrode and the first main surface;

a first gate electrode provided on the first main surface with the insulating film interposed between the first gate electrode and the first main surface;

a second gate electrode provided on the first main surface with the insulating film interposed between the second gate electrode and the first main surface; and a collector electrode provided on the second main surface, wherein the pair of trench electrodes of the IGBT include a first trench electrode and a second trench electrode, wherein the pair of trench electrodes of the diode include two third trench electrodes, wherein the first trench electrode connects to the first gate electrode, wherein the emitter layer, the channel layer and the second trench electrode connect to the emitter electrode, and wherein the third trench electrode connects to the second gate electrode.

9. The semiconductor device according to claim 8, wherein a negative voltage is applied to the first trench electrode after a negative voltage is applied to the third trench electrode, and a positive voltage is applied to the first trench electrode after a positive voltage is applied to the third trench electrode.

10. A semiconductor device comprising:

a semiconductor substrate having a first main surface and a second main surface opposite to the first main surface, wherein, when viewed from a first main surface side, the semiconductor substrate includes:

an IGBT region including a plurality of IGBTs formed on the semiconductor substrate;

a diode region disposed to surround the IGBT region and including a plurality of diodes formed on the semiconductor substrate; and a peripheral region disposed to surround the diode region, wherein the IGBT includes:

a first conductive type drift layer;

a first conductive type barrier layer provided closer to the first main surface side than the drift layer;

a second conductive type channel layer provided closer to the first main surface side than the barrier layer;

a first conductive type emitter layer provided closer to the first main surface side than the channel layer;

a pair of trench electrodes provided to sandwich the barrier layer, the channel layer and the emitter layer from both sides in one direction in a plane parallel to the first main surface;

a trench insulating film provided between the trench electrodes and the drift layer, the barrier layer, the channel layer and the emitter layer;

a first conductive type field stop layer provided closer to a second main surface side than the drift layer; and a second conductive type collector layer provided closer to the second main surface side than the field stop layer, and wherein the diode includes:

the first conductive type drift layer;

a first conductive type semiconductor layer provided closer to the first main surface side than the drift layer;

the second conductive type channel layer provided closer to the first main surface side than the semiconductor layer;

the pair of trench electrodes provided to sandwich the semiconductor layer and the channel layer from both sides in the one direction;

the trench insulating film provided between the trench electrodes and the drift layer, the semiconductor layer and channel layer;

the first conductive type field stop layer provided closer to the second main surface side than the drift layer; and a first conductive type cathode layer provided closer to the second main surface side than the field stop layer, wherein a semiconductor substrate of the peripheral region includes:

the drift layer;

a plurality of second conductive-type floating layers provided on the drift layer, and provided to sandwich a part of the drift layer in the one direction;

an insulating film provided on the drift layer and the floating layer adjacent to the drift layer;

a planar gate provided on the drift layer and the floating layer adjacent to the drift layer with the insulating film interposed between the drift layer and the floating layer;

the first conductive type field stop layer provided closer to the second main surface side than the drift layer; and the first conductive type cathode layer provided closer to the second main surface side than the field stop layer.

11. The semiconductor device according to claim 10, wherein a negative voltage is applied to the planar gate in a case of turning off the IGBT.

\* \* \* \* \*